US012363952B2

(12) United States Patent
Huang et al.

(10) Patent No.: US 12,363,952 B2
(45) Date of Patent: Jul. 15, 2025

(54) ACTIVE DEVICE SUBSTRATE AND MANUFACTURING METHOD OF ACTIVE DEVICE SUBSTRATE

(71) Applicant: AUO Corporation, Hsinchu (TW)

(72) Inventors: Chen-Shuo Huang, Hsinchu (TW); Shang-Lin Wu, Hsinchu (TW); Kuo-Kuang Chen, Hsinchu (TW); Chih-Hung Tsai, Hsinchu (TW)

(73) Assignee: AUP Corporation, Hsinchu (TW)

( * ) Notice: Subject to any disclaimer, the term of this patent is extended or adjusted under 35 U.S.C. 154(b) by 469 days.

(21) Appl. No.: 17/879,802

(22) Filed: Aug. 3, 2022

(65) Prior Publication Data
US 2023/0187554 A1    Jun. 15, 2023

Related U.S. Application Data

(60) Provisional application No. 63/287,695, filed on Dec. 9, 2021.

(30) Foreign Application Priority Data

Jun. 16, 2022 (TW) .................................. 111122489

(51) Int. Cl.
*H10D 30/67*         (2025.01)
*H10D 30/01*         (2025.01)
(Continued)

(52) U.S. Cl.
CPC ....... *H10D 30/6755* (2025.01); *H10D 30/031* (2025.01); *H10D 30/6757* (2025.01);
(Continued)

(58) Field of Classification Search
CPC ............ H10D 30/6755; H10D 30/031; H10D 30/675; H10D 62/151; H10D 86/423;
(Continued)

(56) References Cited

U.S. PATENT DOCUMENTS 6,869,834 B2    3/2005 Lin
8,907,343 B2    12/2014 Xi
(Continued)

FOREIGN PATENT DOCUMENTS

CN        106876412    6/2017
JP        2013089875   5/2013
(Continued)

*Primary Examiner* — Dale E Page
*Assistant Examiner* — Cristian A Tivarus
(74) *Attorney, Agent, or Firm* — JCIPRNET

(57) ABSTRACT

An active device substrate includes a substrate, a first thin film transistor located above the substrate and a second thin film transistor located above the substrate. The first thin film transistor includes a first metal oxide layer, a first gate, a first source and a first drain. A first gate dielectric layer and a second gate dielectric layer are located between the first gate and the first metal oxide layer. The second thin film transistor includes a second metal oxide layer, a second gate, a second source and a second drain. The second gate dielectric layer is located between the second gate and the second metal oxide layer, and the second metal oxide layer is located between the first gate dielectric layer and the second gate dielectric layer. The first gate and the second gate belong to a same patterned layer.

14 Claims, 17 Drawing Sheets

(51) Int. Cl.
*H10D 62/13* (2025.01)
*H10D 86/40* (2025.01)
*H10D 86/60* (2025.01)

(52) U.S. Cl.
CPC ......... *H10D 62/151* (2025.01); *H10D 86/423* (2025.01); *H10D 86/481* (2025.01); *H10D 86/60* (2025.01)

(58) Field of Classification Search
CPC ...... H10D 86/481; H10D 86/60; H10D 99/00; H10D 86/411; H10D 86/021; H10D 86/431; H10D 86/40; H10D 86/471; H01L 23/642
See application file for complete search history.

(56) References Cited

U.S. PATENT DOCUMENTS

| | | | |
|---|---|---|---|
| 9,722,095 B2 | 8/2017 | Koezuka et al. | |
| 10,468,434 B2 | 11/2019 | Lee et al. | |
| 11,063,068 B2 | 7/2021 | Jeon et al. | |
| 11,088,173 B2 | 8/2021 | Lee et al. | |
| 2004/0051101 A1* | 3/2004 | Hotta | H10D 86/40 257/E27.111 |
| 2014/0117362 A1 | 5/2014 | Xi | |
| 2017/0294456 A1* | 10/2017 | Lee | H10D 86/60 |
| 2017/0309649 A1* | 10/2017 | Hayashi | H10D 86/425 |
| 2018/0122955 A1* | 5/2018 | Aichi | H10D 86/0221 |
| 2019/0096919 A1* | 3/2019 | Matsukizono | H10D 86/441 |
| 2020/0013807 A1 | 1/2020 | Lee et al. | |
| 2021/0020665 A1* | 1/2021 | Yamazaki | H10D 86/60 |
| 2021/0335837 A1 | 10/2021 | Lee et al. | |

FOREIGN PATENT DOCUMENTS

| | | |
|---|---|---|
| TW | 565944 | 12/2003 |
| TW | I292957 | 1/2008 |
| TW | 201416233 | 5/2014 |
| TW | 201803095 | 1/2018 |
| TW | 202036895 | 10/2020 |
| TW | 202119380 | 5/2021 |

* cited by examiner

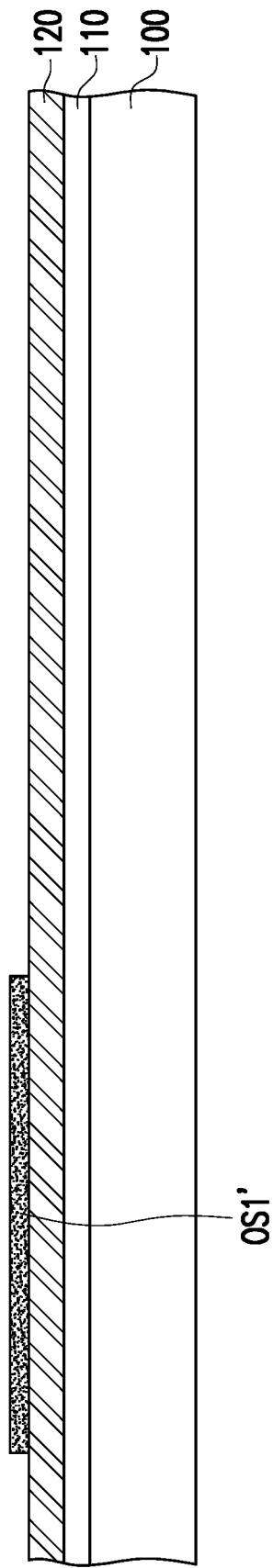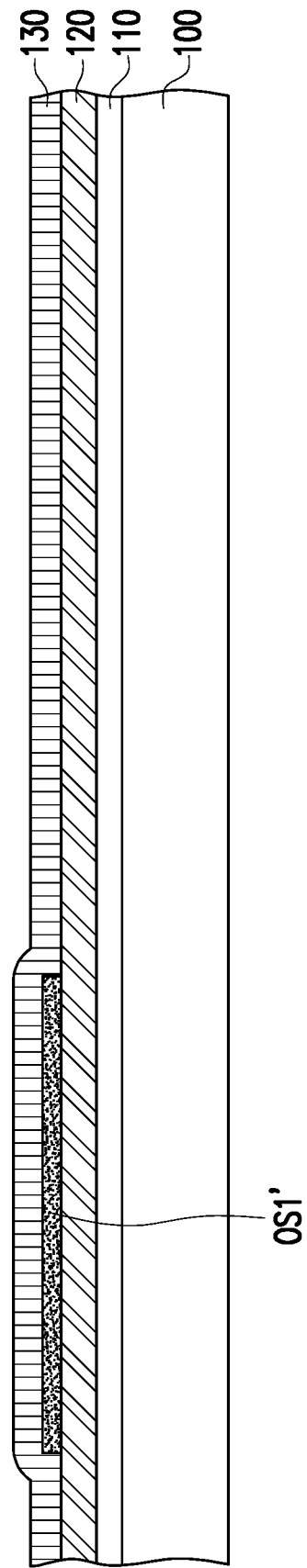
FIG. 2A
FIG. 2B

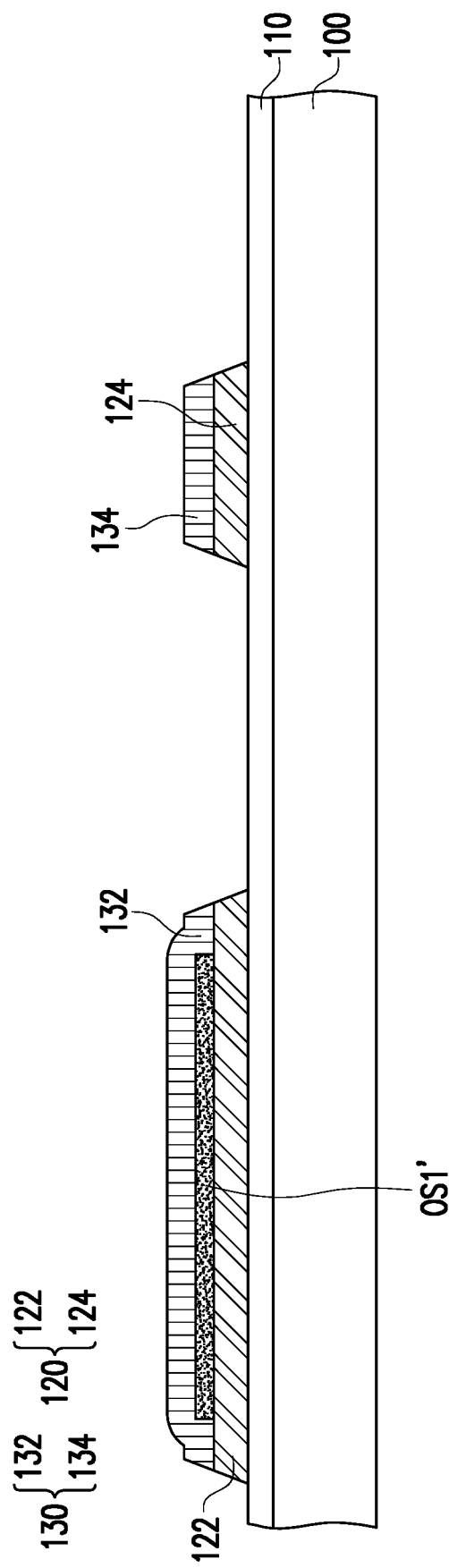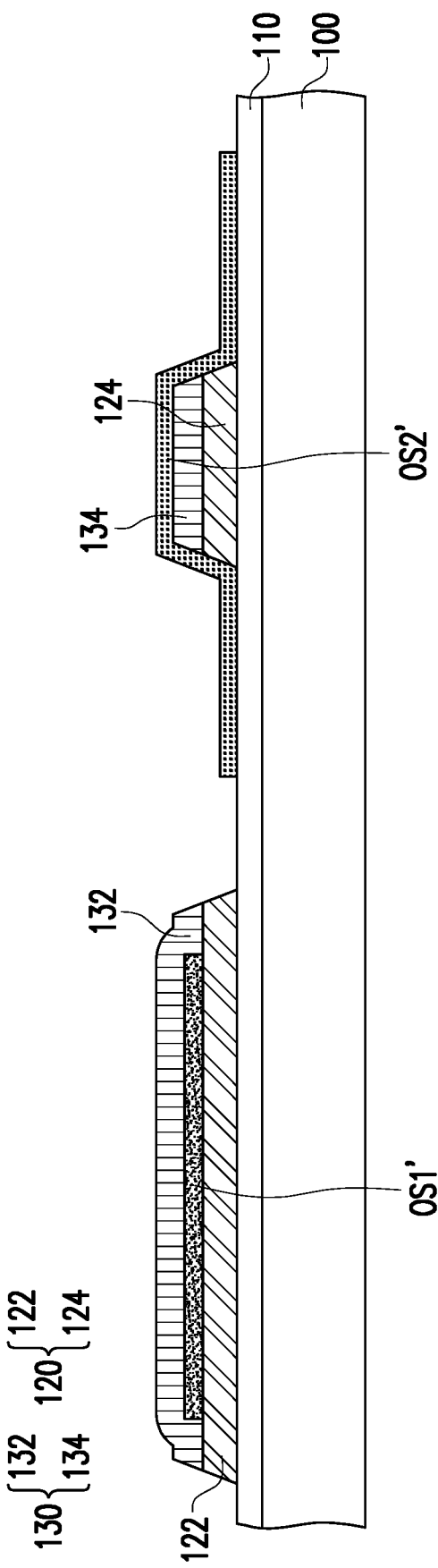

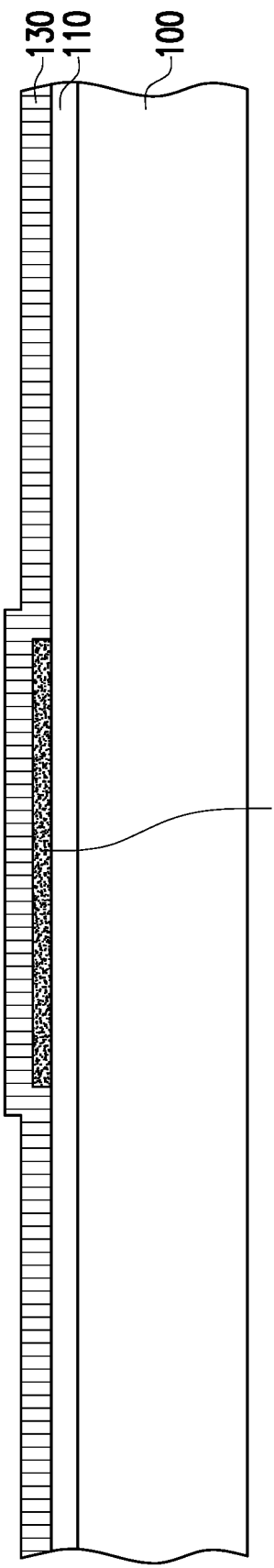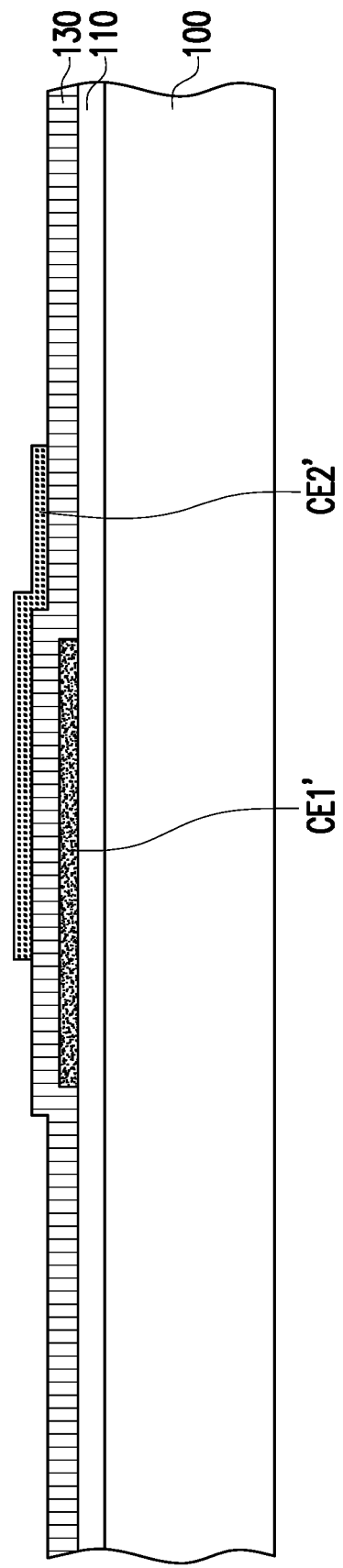

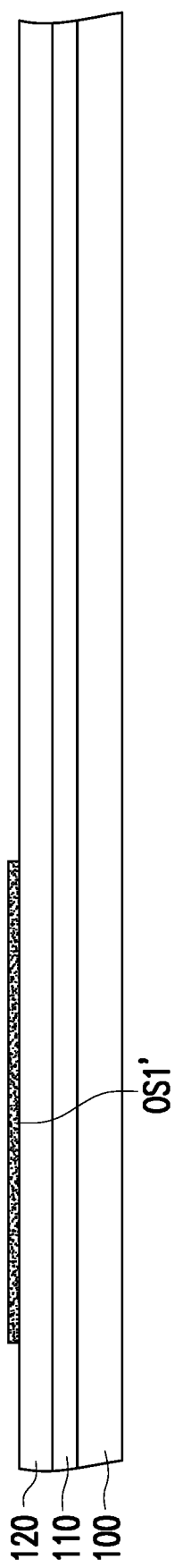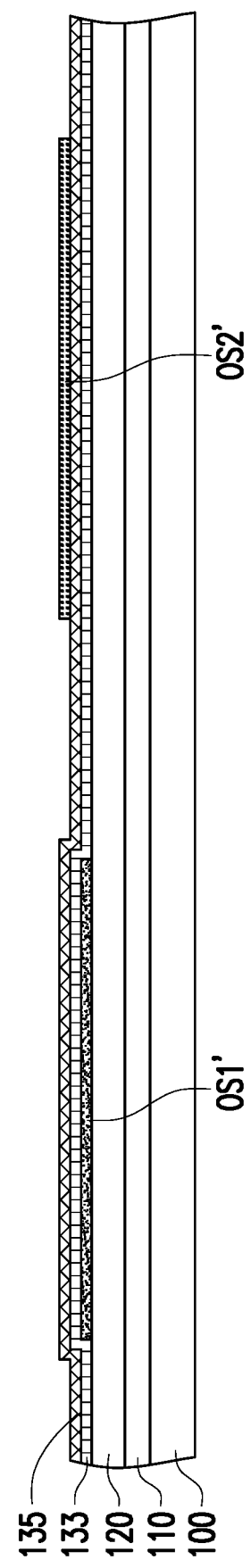
FIG. 8A
FIG. 8B

ACTIVE DEVICE SUBSTRATE AND MANUFACTURING METHOD OF ACTIVE DEVICE SUBSTRATE

CROSS-REFERENCE TO RELATED APPLICATION

This application claims the priority benefit of U.S. provisional application Ser. No. 63/287,695, filed on Dec. 9, 2021 and Taiwan application serial no. 111122489, filed on Jun. 16, 2022. The entirety of each of the above-mentioned patent applications is hereby incorporated by reference herein and made a part of this specification.

BACKGROUND

Technical Field

The present invention is related to an active device substrate, capacitive device and a manufacturing method of the active device substrate.

Description of Related Art

Generally speaking, an electronic device usually contains many active components or passive components for different purposes. Multiple deposition processes and multiple doping processes usually need to be performed to fabricate the active components or the passive components with different characteristics. This results in high production costs and long production times for manufacturing the electronic device.

SUMMARY

The present invention provides an active device substrate and a manufacturing method thereof. A first thin film transistor and a second thin film transistor are integrated in the active device substrate, and the active device substrate has the advantage of low production cost.

The present invention provides a capacitive device, in which the first metal oxide layer is doped with hydrogen in the first buffer layer, thereby reducing the resistivity of the first metal oxide layer.

At least one embodiment of the present invention provides an active device substrate. The active device substrate includes a substrate, a first thin film transistor located above the substrate and a second thin film transistor located above the substrate. The first thin film transistor includes a first metal oxide layer, a first gate, a first source and a first drain. A first gate dielectric layer and a second gate dielectric layer are located between the first gate and the first metal oxide layer. The first source and the first drain are electrically connected with the first metal oxide layer. The second thin film transistor includes a second metal oxide layer, a second gate, a second source and a second drain. The second gate dielectric layer is located between the second gate and the second metal oxide layer, and the second metal oxide layer is located between the first gate dielectric layer and the second gate dielectric layer. The first gate and the second gate belong to the same patterned layer. The second source and the second drain are electrically connected with the second metal oxide layer.

At least one embodiment of the present invention provides a capacitive device. The capacitive device includes a substrate, a first buffer layer, a first metal oxide layer, a first dielectric layer and a second metal oxide layer. The first buffer layer is located above the substrate, and the first buffer layer contains hydrogen. The first metal oxide layer is in contact with the upper surface of the first buffer layer. The first dielectric layer is located on the first metal oxide layer. The second metal oxide layer is located on the first dielectric layer and at least partially overlapping with the first metal oxide layer. The resistivity of the first metal oxide layer is different from the resistivity of the second metal oxide layer.

At least one embodiment of the present invention provides an active device substrate. The active device substrate includes a substrate, a first thin film transistor located above the substrate and a second thin film transistor located above the substrate. The first thin film transistor includes a first metal oxide layer, a first gate, a first source and a first drain. A first gate dielectric layer, a second gate dielectric layer, a third gate dielectric layer and a fourth gate dielectric layer are located between the first gate and the first metal oxide layer. The first source and the first drain are electrically connected with the first metal oxide layer. The second thin film transistor includes a second metal oxide layer, a second gate, a second source and a second drain. The third gate dielectric layer and the fourth gate dielectric layer are located between the second gate and the second metal oxide layer. The second metal oxide layer is located between the second gate dielectric layer and the third gate dielectric layer. The oxygen concentration of the second gate dielectric layer and the oxygen concentration of the third gate dielectric layer are higher than that of the first gate dielectric layer. The second source and the second drain are electrically connected with second metal oxide layer.

At least one embodiment of the present invention provides a manufacturing method of an active device substrate, including: forming a first metal oxide layer above the substrate; forming a first gate dielectric layer above the first metal oxide layer; forming a second gate dielectric layer above the first gate dielectric layer, wherein the process temperature for forming the second gate dielectric layer is lower than the process temperature for forming the first gate dielectric layer, and the oxygen concentration of the second gate dielectric layer is higher than that of the first gate dielectric layer; forming a second metal oxide layer above the second gate dielectric layer; forming a third gate dielectric layer above the second metal oxide layer, wherein the process temperature for forming the third gate dielectric layer is lower than the process temperature for forming the first gate dielectric layer, and the oxygen concentration of the third gate dielectric layer is higher than that of the first gate dielectric layer; forming a fourth gate dielectric layer above the third gate dielectric layer; forming a first gate and a second gate above the fourth gate dielectric layer, wherein the first gate dielectric layer, the second gate dielectric layer, the third gate dielectric layer and the fourth gate dielectric layer are located between the first gate and the first metal oxide layer, and the third gate dielectric layer and the fourth gate dielectric layer are located between the second gate and the second metal oxide layer; forming a first source and a first drain electrically connected with the first metal oxide layer; forming a second source and a second drain electrically connected with the second metal oxide layer.

BRIEF DESCRIPTION OF THE DRAWINGS

FIG. 2A to FIG. 2F are schematic cross-sectional views of the manufacturing method of the active device substrate of FIG. 1.

FIG. 6A to FIG. 6D are schematic cross-sectional views of the manufacturing method of the capacitive device of FIG. 5.

FIG. 8A to FIG. 8D are schematic cross-sectional views of the manufacturing method of the active device substrate of FIG. 7.

DESCRIPTION OF THE EMBODIMENTS

Figure 1:
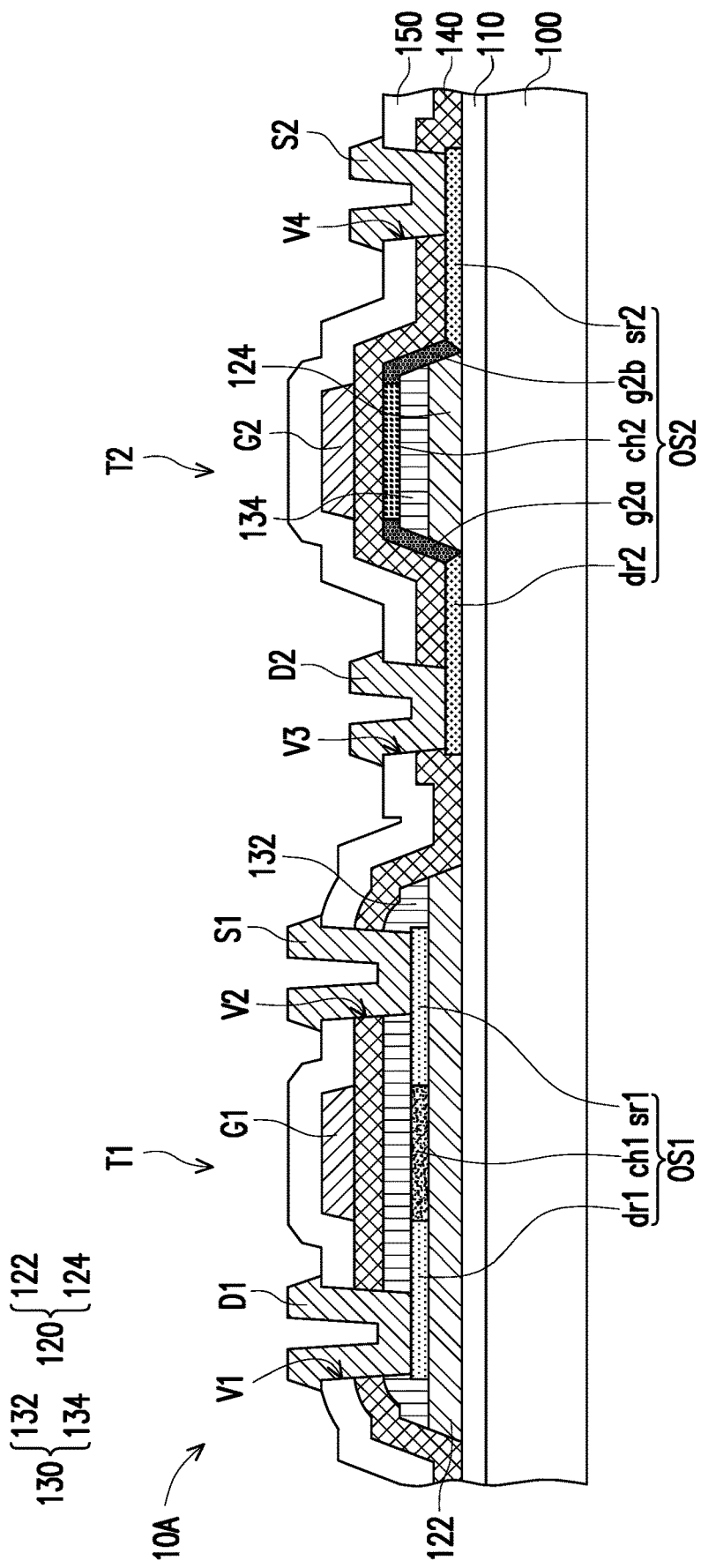
FIG. 1 is a schematic cross-sectional view of an active device substrate of an embodiment according to the present invention.

FIG. 1 is a schematic cross-sectional view of an active device substrate of an embodiment according to the present invention.

Referring to FIG. 1, the active device substrate 10A includes a substrate 100, a first thin film transistor T1 and a second thin film transistor T2.

The material of the substrate 100 can be glass, quartz, organic polymer or opaque/reflective material (e.g., conductive material, metal, wafer, ceramic or other suitable materials) or other suitable materials. If conductive material or metal is used, an insulating layer (not shown) is covered on the substrate 100 to avoid short circuit problems. In some embodiments, the substrate 100 is a flexible substrate, and the material of the substrate 100 is, for example, polyethylene terephthalate (PET), polyethylene naphthalate (PEN), polyester (PES), polymethylmethacrylate (PMMA), polycarbonate (PC), polyimide (PI) or metal foil or other flexible materials.

In some embodiments, a first buffer layer 110 is located above the substrate 100, and the first buffer layer 110 contains hydrogen elements. For example, the material of the first buffer layer 110 includes hydrogen-containing silicon nitride (or hydrogenated silicon nitride) or other suitable materials. A second buffer layer 120 is located on the first buffer layer 110, and the second buffer layer 120 contains oxygen elements. For example, the second buffer layer 120 includes an oxygen-containing insulating material such as oxide or oxynitride. For example, the oxygen-containing insulating material may be silicon oxide, silicon oxynitride, aluminum oxide, hafnium oxide, or other suitable materials.

In some embodiments, the first buffer layer 110 is blanket-formed on substrate 100, and the second buffer layer 120 is patterned so as not to cover a portion of the first buffer layer 110. In some embodiment, the second buffer layer 120 includes a first oxygen-containing structure 122 and a second oxygen-containing structure 124. In some embodiment, the first oxygen-containing structure 122 and the second oxygen-containing structure 124 are separated from each other. In some embodiments, the thickness of the first buffer layer 110 is in a range from 300 angstroms to 6000 angstroms. In some embodiments, the thickness of the second buffer layer 120 is in a range from 200 angstroms to 6000 angstroms.

The first thin film transistor T1 and the second thin film transistor T2 are located above the substrate 100. In some embodiments, the first thin film transistor T1 and the second thin film transistor T2 are located on the second buffer layer 120. The first thin film transistor T1 includes a first metal oxide layer OS1, a first gate G1, a first source S1 and a first drain D1. The second thin film transistor T2 includes a second metal oxide layer OS2, a second gate G2, a second source S2 and a second drain D2.

The first metal oxide layer OS1 is located on the first oxygen-containing structure 122, and the first oxygen-containing structure 122 is located between the first metal oxide layer OS1 and the first buffer layer 110. The first metal oxide layer OS1 is in contact with the top surface of the first oxygen-containing structure 122. The first buffer layer 110 and the first oxygen-containing structure 122 are located between the first metal oxide layer OS1 and the substrate 100. The first gate dielectric layer 130 and the second gate dielectric layer 140 are located on the first metal oxide layer OS1.

The first metal oxide layer OS1 includes a first source region sr1, a first drain region dr1, and a first channel region ch1 located between the first source region sr1 and the first drain region dr1. In this embodiment, the first source region sr1, the first drain region dr1 and the first channel region ch1 are both located between the second buffer layer 120 and the first gate dielectric layer 130. The distance between the first channel region ch1 and the substrate 100 is substantially equal to the distance between the first source region sr1 and the substrate 100 and the distance between the first drain region dr1 and the substrate 100.

In some embodiments, the first oxygen-containing structure 122 under the first metal oxide layer OS1 can supplement oxygen to the first metal oxide layer OS1 so as to increase the resistivity of the first metal oxide layer OS1. In this embodiment, the first oxygen-containing structure 122 under the first source region sr1, the first drain region dr1 and the first channel region ch1 has substantially uniform thickness.

Table 1 shows the sheet resistance $R_{n+}$ of the first source region sr1 and the first drain region dr1 and the threshold voltage Vth of the first thin film transistor T1 in some embodiments, wherein the first metal oxide layers OS1 (take indium gallium zinc oxide as an example) are formed on the second buffer layer 120 (take silicon oxynitride as an example) having different thicknesses.

TABLE 1

| | The thickness of the second buffer layer | $R_{n+}$(ohm/sq) | Vth(V) |
|---|---|---|---|
| Example 1 | 50 nm | 759.1~773.5 | 0.22~0.28 |
| Example 2 | 85 nm | 847.6~977 | 0.3~0.32 |
| Example 3 | 150 nm | 1628.6~2138.5 | 0.33~0.35 |

It can be known from Table 1 that the thickness of the oxygen-containing layer under the first metal oxide layer OS1 affects the sheet resistance $R_{n+}$ of the first source region sr1 and the first drain region dr1 and the threshold voltage Vth of the first thin film transistor T1. The thicker the oxygen-containing layer under the first metal oxide layer OS1, the higher the $R_{n+}$ and Vth.

In some embodiments, the first gate dielectric layer 130 includes a first dielectric structure 132 and a second dielectric structure 134. The first dielectric structure 132 is located above the first oxygen-containing structure 122 and covers the first metal oxide layer OS1. The second dielectric structure 134 is located above the second oxygen-containing structure 124, and the second oxygen-containing structure 124 is located between the second dielectric structure 134 and the first buffer layer 110.

The second metal oxide layer OS2 is located on the second dielectric structure 134 and in contact with the top surface of the second dielectric structure 134, the side surface of the second dielectric structure 134, the side surface of the second oxygen-containing structure 124 and the top surface of the first buffer layer 110. The second gate dielectric layer 140 is located on the first dielectric structure 132 and the second metal oxide layer OS2. The second metal oxide layer OS2 is located between the second gate dielectric structure 134 of the first gate dielectric layer 130 and the second gate dielectric layer 140 and between the first buffer layer 110 and the second gate dielectric layer 140. The first buffer layer 110, the second oxygen-containing structure 124 and the second dielectric structure 134 are located between the second metal oxide layer OS2 and the substrate 100.

The second metal oxide layer OS2 includes the second drain region dr2, the second source region sr2, the second channel region ch2, the resistivity gradient region g2a located between the second drain region dr2 and the second channel region ch2 and the resistivity gradient region g2b located between the second source region sr2 and the second channel region ch2. The second channel region ch2 is in contact with the top surface of the second dielectric structure 134. The resistivity gradient region g2a and the resistivity gradient region g2b are in contact with the side surface of the second dielectric structure 134 and the side surface of the second oxygen-containing structure 124. The second drain region dr2 and the second source region sr2 are in contact with the top surface of the first buffer layer 110. The distance between the second channel region ch2 and the substrate 100 is greater than the distance between the second drain region dr2 and the substrate 100 and the distance between the second source region sr2 and the substrate 100.

In some embodiments, the second oxygen-containing structure 124 and the second dielectric structure 134 under the second metal oxide layer OS2 can supplement oxygen to the second metal oxide layer OS2 so as to increase the resistivity of the second metal oxide layer OS2.

The ability of the second oxygen-containing structure 124 and the second dielectric structure 134 to supplement oxygen to the second metal oxide layer OS2 is affected by their thickness. Under the second channel region ch2, the overall thickness of the second oxygen-containing structure 124 and the second dielectric structure 134 is larger, so the resistivity of the second channel region ch2 is larger; under the resistivity gradient region g2a and the resistivity gradient region g2b, the overall thickness of the second oxygen-containing structure 124 and the second dielectric structure 134 decreases gradually, so the resistivity of the resistivity gradient region g2a and the resistivity gradient region g2b also decreases gradually. There is no oxygen-containing structure 124 and the second dielectric structure 134 under the second drain region dr2 and the second source region sr2, and the second drain region dr2 and the second source region sr2 have lower resistivity than that of the second channel region ch2, the resistivity gradient region g2a and the resistivity gradient region g2b. In some embodiment, the oxygen concentration of the second channel region ch2 is greater than that of the resistivity gradient region g2a and the resistivity gradient region g2b, and the oxygen concentration of the resistivity gradient region g2a and the resistivity gradient region g2b is greater than that of the second drain region dr2 and the second source region sr2.

In some embodiments, the materials of the first metal oxide layer OS1 and the second metal oxide layer OS2 include indium gallium tin zinc oxide (IGTZO), or quaternary metal compounds such as indium gallium zinc oxide (IGZO), indium tin zinc oxide (ITZO), aluminum zinc tin oxide (AZTO)) or indium tungsten zinc oxide (IWZO), or oxides comprising ternary metal containing any three of gallium (Ga), zinc (Zn), indium (In), tin (Sn), aluminum (Al), and tungsten (W), or lanthanide rare earth doped metal oxide (e.g., Ln-IZO). In some embodiments, the first metal oxide layer OS1 and the second metal oxide layer OS2 include the same material. In other embodiments, the first metal oxide layer OS1 and the second metal oxide layer OS2 include different materials. In some embodiments, the carrier mobility of the second channel region ch2 of the second metal oxide layer OS2 is different from (greater than or smaller than) the carrier mobility of the first channel region ch1 of the first metal oxide layer OS1.

In some embodiments, both of the first gate dielectric layer 130 and the second gate dielectric layer 140 include an oxygen-containing insulating material such as oxide or oxynitride. For example, the oxygen-containing insulating material may be silicon oxide, silicon oxynitride, aluminum oxide, hafnium oxide, or other suitable materials. In some embodiments, the thickness of the first gate dielectric layer 130 is in a range from 100 angstroms to 2000 angstroms. In some embodiments, the thickness of the second gate dielectric layer 140 is in a range from 400 angstroms to 3000 angstroms.

The first gate G1 and the second gate G2 are located on the second gate dielectric layer 140 and respectively overlapping with the first channel region ch1 and the second channel region ch2. The first dielectric structure 132 and the second gate dielectric layer 140 are located between the first gate G1 and the first metal oxide layer OS1. The second gate dielectric layer 140 is located between the second gate G2 and the second metal oxide layer OS2. In this embodiment, the thickness of the insulating material(s) between the first gate G1 and the first metal oxide layer OS1 is greater than the thickness of the insulating material(s) between the second gate G2 and the second metal oxide layer OS2. Thereby, the first thin film transistor T1 and the second thin film transistor T2 have different characteristics. For example, the first thin film transistor T1 has a larger subthreshold swing and better long-term operation reliability; the second thin film transistor T2 has high operating current and small subthreshold swing, and the second thin film transistor T2 can perform high-speed switching.

The material of the first gate G1 and the second gate G2 may include metal, such as chromium (Cr), gold (Au), silver (Ag), copper (Cu), tin (Sn), lead (Pb), hafnium (HO, tungsten (W), molybdenum (Mo), neodymium (Nd), titanium (Ti), tantalum (Ta), aluminum (Al), zinc (Zn) or an alloy of any combination of the above metals or a stack of the above metals and/or alloys, but the present invention is not limited thereto. Other conductive materials, such as metal nitride, metal oxide, metal oxynitride, stacked layers of metal and other conductive materials, or other materials with conductive properties, can also be used as the first gate G1 and the second gate G2.

The interlayer dielectric layer 150 is located on the second gate dielectric layer 140 and covers the first gate G1 and the second gate G2. In some embodiments, the material of the interlayer dielectric layer 150 includes silicon oxide, silicon nitride, silicon oxynitride, hafnium oxide, aluminum oxide, or other insulating materials.

The first contact hole V1 and the second contact hole V2 are penetrating through the interlayer dielectric layer 150, the second gate dielectric layer 140 and the first dielectric structure 132. The first drain D1 and the first source S1 are located on the interlayer dielectric layer 150 and are respectively filled into the first contact hole V1 and the second contact hole V2 to electrically connect with the first metal oxide layer OS1. The first drain D1 and the first source S1 are respectively connected to the first drain region dr1 and the first source region sr1 of the first metal oxide layer OS1.

The third contact hole V3 and the fourth contact hole V4 are penetrating through the interlayer dielectric layer 150 and the second gate dielectric layer 140. The second drain D2 and the second source S2 are located on the interlayer dielectric layer 150 and are respectively filled into the third contact hole V3 and the fourth contact hole V4 to electrically connect with the second metal oxide layer OS2. The second drain D2 and the second source S2 are respectively connected to the second drain region dr2 and the second source region sr2 of the second metal oxide layer OS2.

The material of the first drain D1, the first source S1, the second drain D2 and the second source S2 may include metals, such as chromium, gold, silver, copper, tin, lead, hafnium, tungsten, molybdenum, neodymium, titanium, tantalum, aluminum, zinc or an alloy of any combination of the above metals or a stack of the above metals and/or alloys, but the present invention is not limited thereto. Other conductive materials, such as metal nitride, metal oxide, metal oxynitride, stacked layers of metal and other conductive materials, or other materials with conductive properties, can also be used as the first drain D1, the first source S1, the second drain D2 and the second source S2.

FIG. 2A to FIG. 2F are schematic cross-sectional views of the manufacturing method of the active device substrate 10A of FIG. 1.

Referring to FIG. 2A, the first buffer layer 110 is blanket-formed on the substrate 100. The second buffer layer 120 is blanket-formed on the first buffer layer 110. The first metal oxide layer OS1' is formed on the second buffer layer 120. The method of forming the first metal oxide layer OS1' includes a lithography process and an etching process, wherein the etching process may be dry etching or wet etching.

Referring to FIG. 2B, the first gate dielectric layer 130 is blanket-formed on the second buffer layer 120 and the first metal oxide layer OS1'.

Referring to FIG. 2C, the first gate dielectric layer 130 and the second buffer layer 120 are patterned to expose the first buffer layer 110. The method of patterning the first gate dielectric layer 130 and the second buffer layer 120 includes, for example, a lithography process and an etching process, wherein the etching process can be dry etching or wet etching. The second buffer layer 120 includes the first oxygen-containing structure 122 and the second oxygen-containing structure 124 after being patterned. The first gate dielectric layer 130 includes the first dielectric structure 132 and the second dielectric structure 134 after being patterned. The first metal oxide layer OS1' is located between the first oxygen-containing structure 122 and the first dielectric structure 132.

Referring to FIG. 2D, the second metal oxide layer OS2' is formed on the second dielectric structure 134 and the second oxygen-containing structure 124, and a portion of the second metal oxide layer OS2' is in contact with the top surface of the first buffer layer 110.

Figure 2E:
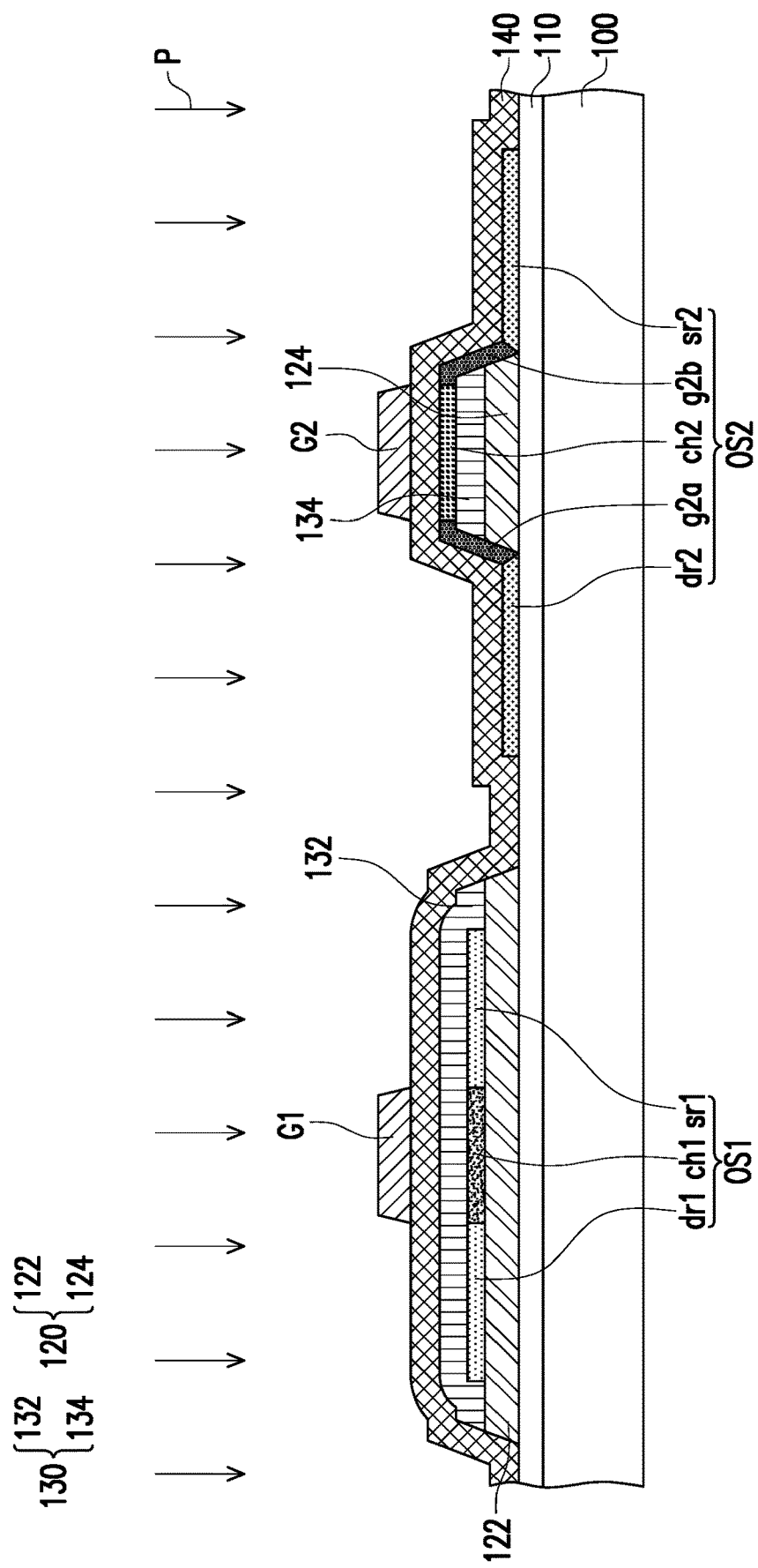

Referring to FIG. 2E, the second gate dielectric layer 140 is blanket-formed on the first buffer layer 110, the first oxygen-containing structure 122, the first dielectric structure 132 and the second metal oxide layer OS2'. The first gate G1 and the second gate G2 are formed on the second gate dielectric layer 140. In some embodiments, the method for forming the first gate G1 and the second gate G2 includes: forming a conductive material layer (not shown) on the second gate dielectric layer 140; forming a patterned photoresist (not shown) on the aforementioned conductive material layer; etching the conductive material layer by using the patterned photoresist as a mask, so as to form the first gate G1 and the second gate G2, wherein the etching process can be dry etch or wet etch; at last, removing the patterned photoresist.

Continuing from the previous, using the first gate G1 and the second gate G2 as a mask, a doping process P is performed on the first metal oxide layer OS1' and the second metal oxide layer OS2' to form the first metal oxide layer OS1 including the first source region sr1, the first drain region dr1 and the first channel region ch1 and the second metal oxide layer OS2 including the second source region sr2, the second drain region dr2, the resistivity gradient region g2a, the resistivity gradient region g2b and the second channel region ch2. In some embodiments, the doping process P is, for example, a hydrogen plasma process or other suitable processes.

In this embodiment, during the process, the second dielectric structure 134 and the second oxygen-containing structure 124 may provide oxygen elements, thereby enhancing the resistivity of the resistivity gradient region g2a, the resistivity gradient region g2b and the second channel region ch2. In some embodiments, during the process, the first buffer layer 110 may provide hydrogen elements, thereby reducing the resistivity of the second source region sr2 and the second drain region dr2. In some embodiments, the resistivity of the first drain region dr1 and the first source region sr2 is different from the resistivity of the second drain region dr2 and the second source region sr2. For example, the resistivity of the second drain region dr2 and the second source region sr2 is smaller than the resistivity of the first drain region dr1 and the first source region sr2.

In this embodiment, the first gate G1 and the second gate G2 belong to the same patterned layer, and the first metal oxide layer OS1 and the second metal oxide layer OS2 can be doped through the same doping process P. Therefore, the fabrication cost of the first thin film transistor and second thin film transistor can be saved.

Figure 2F:
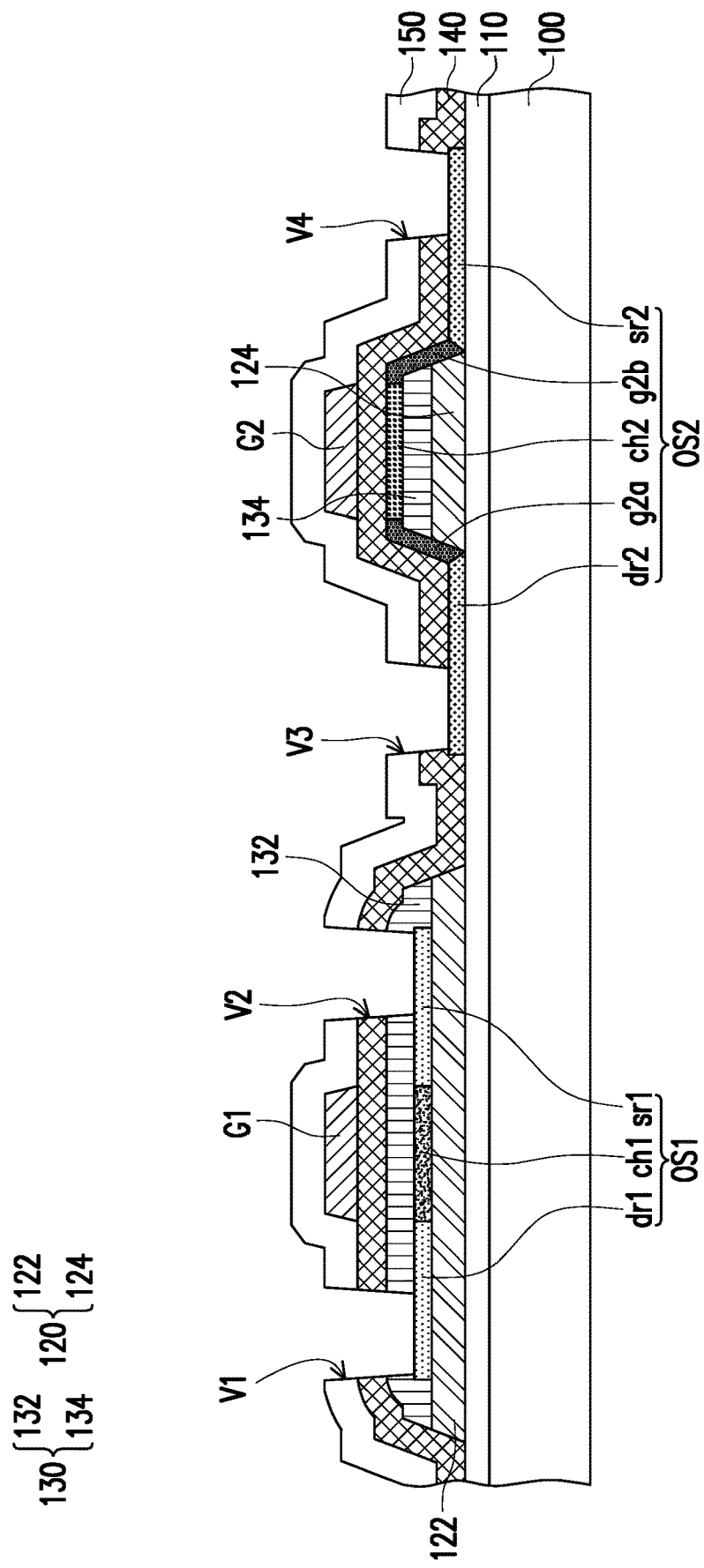

Referring to FIG. 2F, an interlayer dielectric layer 150 is formed on the second gate dielectric layer 140. Then, an etching process is performed to form the first contact hole V1, the second contact hole V2, the third contact hole V3 and the fourth contact hole V4.

Finally, returning to FIG. 1, the first drain D1, the first source S1, the second drain D2 and the second source S2 are formed on the interlayer dielectric layer 150, and are filled into the first contact hole V1, the second contact hole V2, the third contact hole V3 and the fourth contact hole V4. So far, the active device substrate 10A is substantially completed. In some embodiments, the method for forming the first source S1, the first drain D1, the second source S2 and the second drain D2 includes: forming a conductive material layer (not shown) on the interlayer dielectric layer 150; forming a patterned photoresist (not shown) on the aforementioned conductive material layer; etching the conductive material layer by using the patterned photoresist as a mask, so as to form the first source S1, the first drain D1, the second source S2 and the second drain D2; at last, removing the patterned photoresist. In other words, the first source S1, the first drain D1, the second source S2 and the second drain D2 belong to the same patterned layer.

Figure 3:
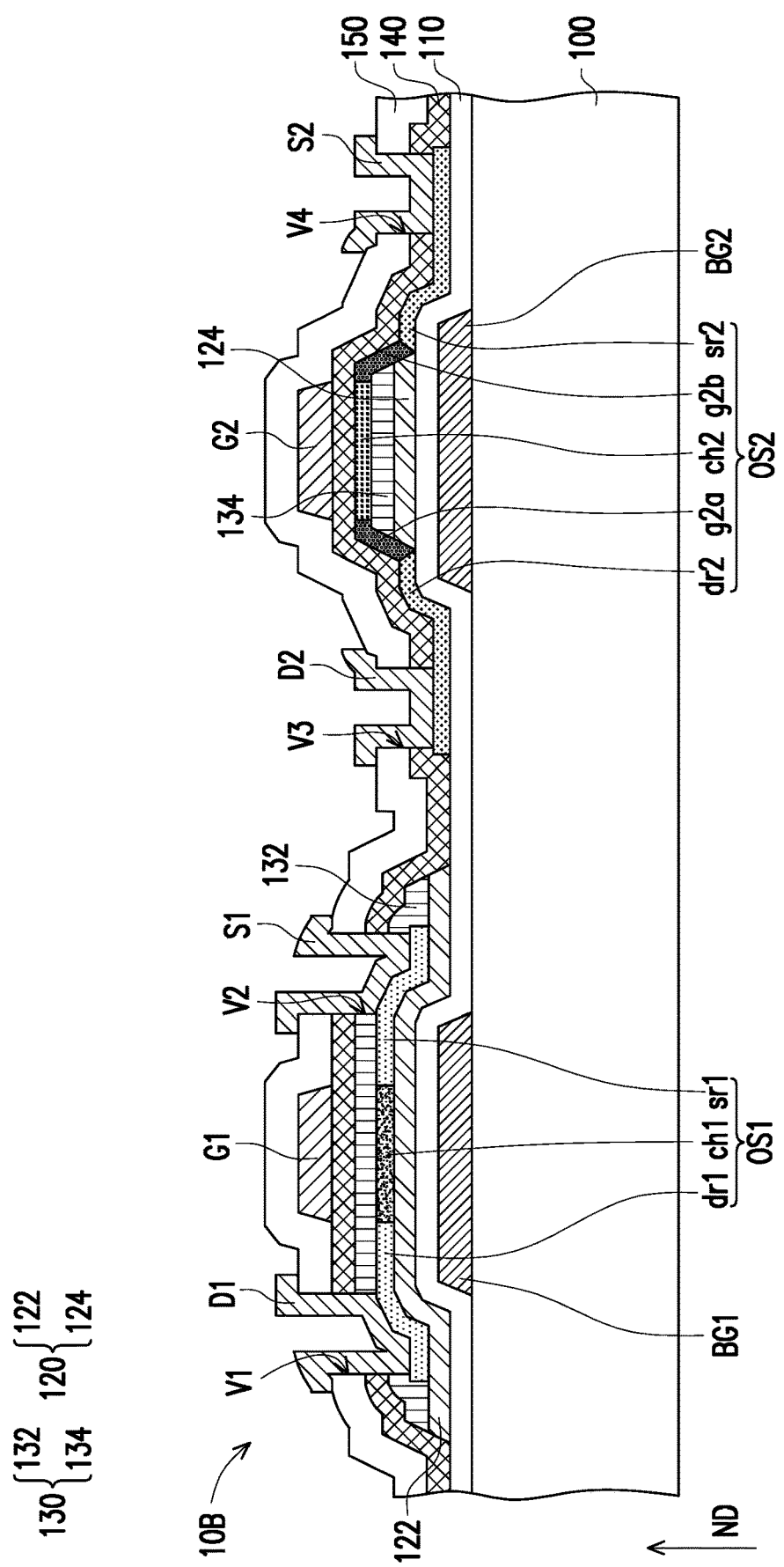
FIG. 3 is a schematic cross-sectional view of an active device substrate of an embodiment according to the present invention.

FIG. 3 is a schematic cross-sectional view of an active device substrate of an embodiment according to the present invention. It should be noted herein that, in embodiments provided in FIG. 3, element numerals and partial content of the embodiments provided in FIG. 1 to FIG. 2F are followed, the same or similar reference numerals being used to represent the same or similar elements, and description of the same technical content being omitted. For a description of an omitted part, reference may be made to the foregoing embodiment, and the descriptions thereof are omitted herein.

The main difference between the active device substrate 10B of FIG. 3 and the active device substrate 10A of FIG. 1 is that: the active device substrate 10B further includes a first bottom gate BG1 and a second bottom gate BG2.

Referring to FIG. 3, the first bottom gate BG1 and the second bottom gate BG2 are located between the first buffer layer 110 and the substrate 100. The first metal oxide layer OS1 is located between the first gate G1 and the first bottom gate BG1. The second metal oxide layer OS2 is located between the second gate G2 and the second bottom gate BG2. In some embodiments, the width of the first bottom gate BG1 is greater than that of the first gate G1, and the width of the second bottom gate BG2 is greater than that of the second gate G2. Therefore, in the normal direction ND of the top surface of the substrate 100, the first bottom gate BG1 is overlapping with a portion of the first source region sr1 and a portion of the first drain region dr1, and the second bottom gate BG2 is overlapping with a portion of the second source region sr2 and a portion of the second drain region dr2.

Figure 4:
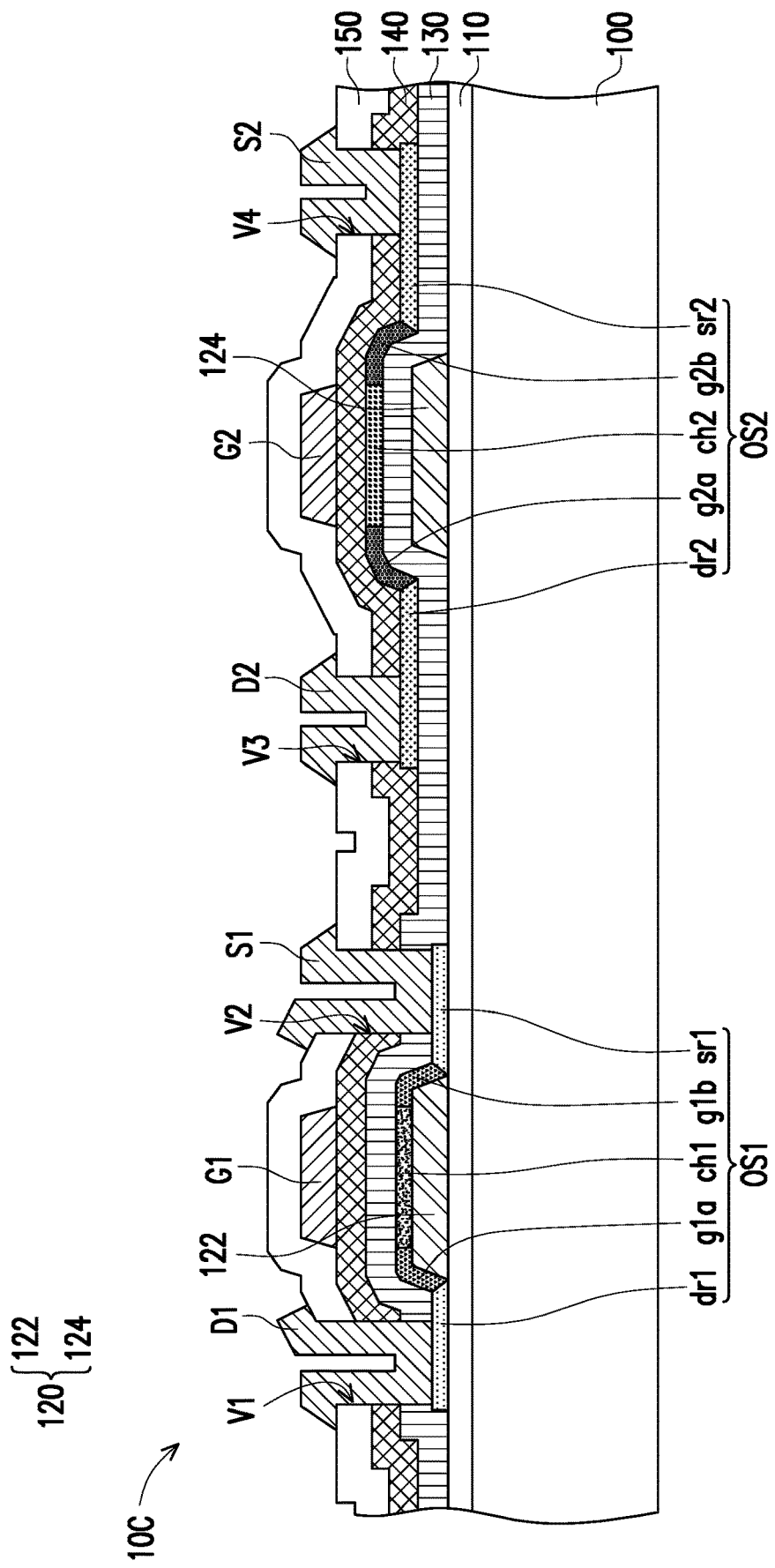
FIG. 4 is a schematic cross-sectional view of an active device substrate of an embodiment according to the present invention.

FIG. 4 is a schematic cross-sectional view of an active device substrate of an embodiment according to the present invention. It should be noted herein that, in embodiments provided in FIG. 4, element numerals and partial content of the embodiments provided in FIG. 1 to FIG. 2F are followed, the same or similar reference numerals being used to represent the same or similar elements, and description of the same technical content being omitted. For a description of an omitted part, reference may be made to the foregoing embodiment, and the descriptions thereof are omitted herein.

The main difference between the active device substrate 10C of FIG. 4 and the active device substrate 10A of FIG. 1 is that: the first metal oxide layer OS1 of the active device substrate 10C is in contact with the top surface and the side surface of the first oxygen-containing structure 122, and the second metal oxide layer OS2 is not in contact with the second oxygen-containing structure 124.

Referring to FIG. 4, the first metal oxide layer OS1 is located on the first oxygen-containing structure 122 and the first buffer layer 110. The first metal oxide layer OS1 is in contact with the top surface of the first oxygen-containing structure 122, the side surface of the first oxygen-containing structure 122 and the top surface of the first buffer layer 110. The first oxygen-containing structure 122 and the first buffer layer 110 are located between the first metal oxide layer OS1 and the substrate 100, and the first oxygen-containing structure 122 is located between the first metal oxide layer OS1 and the first buffer layer 110.

The first metal oxide layer OS1 includes a first source region sr1, a first drain region dr1, a resistivity gradient region g1a located between the first drain region dr1 and the first channel region ch1, and a resistivity gradient region g1b located between the first source region sr1 and the first channel region ch1. In this embodiment, the first channel region ch1 is in contact with the top surface of the first oxygen-containing structure 122, the resistivity gradient region g1a and resistivity gradient region g1b are in contact with the side surface of the first oxygen-containing structure 122, and the first drain region dr1 and the first source region sr1 are in contact with the top surface of the first buffer layer 110. The distance between the first channel region ch1 and the substrate 100 is greater than the distance between the first drain region dr1 and the substrate 100 and the distance between the first source region sr1 and the substrate 100.

The ability of the first oxygen-containing structure 122 to supplement oxygen to the first metal oxide layer OS1 is affected by its thickness. Under the first channel region ch1, the thickness of the first oxygen-containing structure 122 is larger, so the resistivity of the first channel region ch1 is larger; under the resistivity gradient region g1a and resistivity gradient region g1b, the thickness of the first oxygen-containing structure 122 decreases gradually, so the resistivity of the resistivity gradient region g1a and resistivity gradient region g1b also decreases gradually. There is no first oxygen-containing structure 122 under the first drain region dr1 and the first source region sr1, and the first drain region dr1 and the first source region sr1 have lower resistivity than the first channel region ch1, the resistivity gradient region g1a and the resistivity gradient region g1b. In some embodiments, the oxygen concentration of the first channel region ch1 is greater than the oxygen concentration of the resistivity gradient region g1a and the oxygen concentration of the resistivity gradient region g1b. The oxygen concentration of the resistivity gradient region g1a and the oxygen concentration of the resistivity gradient region g1b are greater than the oxygen concentration of the first drain region dr1 and the oxygen concentration of the first source region sr1. In some embodiments, during the process, the first buffer layer 110 may provide hydrogen elements, thereby reducing the resistivity of the first drain region dr1 and the first source region sr1. In some embodiments, when the first metal oxide layer OS1 and the second metal oxide layer OS2 are made of the same material, the resistivity of the first drain region dr1 and the first source region sr1 is different from the resistivity of the second drain region dr2 and the second source region sr2. For example, the resistivity of the first drain region dr1 and the first source region sr1 is smaller than the resistivity of the second drain region dr2 and the second source region sr2.

In some embodiment, the first gate dielectric layer 130 is blanket-formed on the first metal oxide layer OS1 and the second oxygen-containing structure 124. The first gate dielectric layer 130 covers the top surface and sidewall of the second oxygen-containing structure 124.

The second metal oxide layer OS2 is located on the first gate dielectric layer 130 and is in contact with the top surface of the first gate dielectric layer 130. The first buffer layer 110, the second oxygen-containing structure 124 and the first gate dielectric layer 130 are located between the second metal oxide layer OS2 and the substrate 100. The second oxygen-containing structure 124 and the first gate dielectric layer 130 are located between the second metal oxide layer OS2 and the first buffer layer 110. The first gate dielectric layer 130 has protrusions corresponding to the second oxygen-containing structure 124, and the second metal oxide layer OS2 covers the protrusions of the first gate dielectric layer 130, so that the distance between the second channel region ch2 and the substrate 100 is greater than the distance between the second drain region dr2 and substrate 100 and the distance between second source region sr2 and substrate 100.

The second gate dielectric layer 140 is located on the first gate dielectric layer 130 and the second metal oxide layer OS2. The second metal oxide layer OS2 is located between the first gate dielectric layer 130 and the second gate dielectric layer 140.

In this embodiment, the second channel region ch2, the resistivity gradient region g2a, the resistivity gradient region g2b, the second drain region dr2, and the second source region sr2 are both in contact with the top surface of the first gate dielectric layer 130.

In some embodiment, the second oxygen-containing structure 124 and the first gate dielectric layer 130 under the second metal oxide layer OS2 may supplement oxygen to the second metal oxide layer OS2. The oxygen in the second oxygen-containing structure 124 and the first gate dielectric layer 130 diffuses into the second metal oxide layer OS2 to increase the resistivity of the second metal oxide layer OS2. The ability of the second oxygen-containing structure 124 and the first gate dielectric layer 130 to supplement oxygen to the second metal oxide layer OS2 is affected by their overall thickness. Under the second channel region ch2, the overall thickness of the second oxygen-containing structure 124 and the first gate dielectric layer 130 is larger, so the resistivity of the second channel region ch2 is larger; under the resistivity gradient region g2a and the resistivity gradient region g2b, the overall thickness of the second oxygen-containing structure 124 and the first gate dielectric layer 130 decreases gradually, so the resistivity of the resistivity gradient region g2a and the resistivity gradient region g2b also decreases gradually. There is no second oxygen-containing structure 124 under the second drain region dr2 and the second source region sr2, and the second drain region dr2 and the second source region sr2 have lower resistivity than the second channel region ch2, the resistivity gradient region g2a and the resistivity gradient region g2b. In some embodiment, the oxygen concentration of the second channel region ch2 is greater than the oxygen concentration of the resistivity gradient region g2a and the oxygen concentration of the resistivity gradient region g2b. The oxygen concentration of the resistivity gradient region g2a and the oxygen concentration of the resistivity gradient region g2b are greater than the oxygen concentration of the second drain region dr2 and the oxygen concentration of the second source region sr2.

Figure 5:
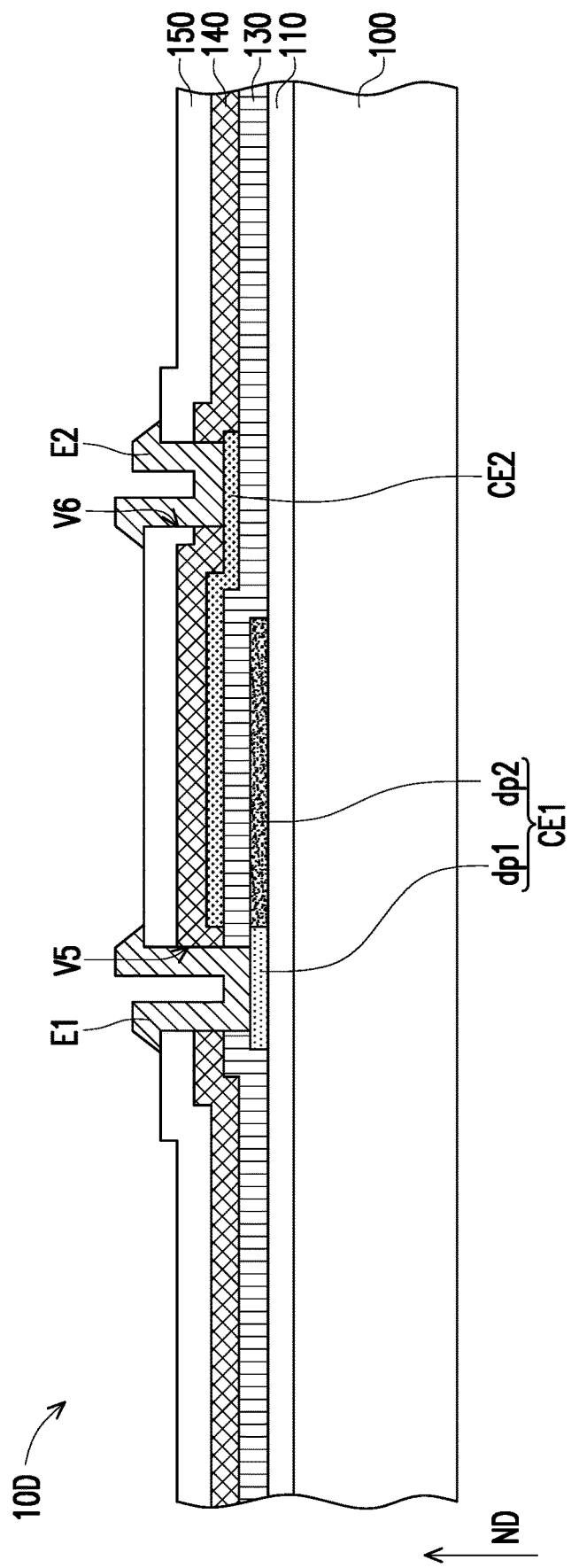
FIG. 5 is a schematic cross-sectional view of a capacitive device of an embodiment according to the present invention.

FIG. 5 is a schematic cross-sectional view of a capacitive device of an embodiment according to the present invention. It should be noted herein that, in embodiments provided in FIG. 5, element numerals and partial content of the embodiments provided in FIG. 1 to FIG. 2F are followed, the same or similar reference numerals being used to represent the same or similar elements, and description of the same technical content being omitted. For a description of an omitted part, reference may be made to the foregoing embodiment, and the descriptions thereof are omitted herein.

Referring to FIG. 5, the capacitive device 10D includes a substrate 100, a first buffer layer 110, a first metal oxide layer CE1, a first gate dielectric layer 130 (also referred as a first dielectric layer) and a second metal oxide layer CE2. In this embodiment, the capacitive device 10D further includes a second gate dielectric layer 140 (also referred as a second dielectric layer), an interlayer dielectric layer 150, a first electrode E1 and a second electrode E2.

The first buffer layer 110 is located above the substrate 100, and the first buffer layer 110 contains hydrogen elements. The first metal oxide layer CE1 is in contact with the top surface of the first buffer layer 110. The first gate dielectric layer 130 is located on the first metal oxide layer CE1. The second metal oxide layer CE2 is located on the first gate dielectric layer 130 and is at least partially overlapping with the first metal oxide layer CE1. The resistivity of the first metal oxide layer CE1 is different from the resistivity of the second metal oxide layer CE2. For example, the first metal oxide layer CE1 and the second metal oxide layer CE2 include different materials, or the first metal oxide layer CE1 and the second metal oxide layer CE2 include different doping concentrations. In this embodiment, the first metal oxide layer CE1 includes a first doped region dp1 not overlapping with the second metal oxide layer CE2 in the normal direction ND and a second doped region dp2 overlapping with the second metal oxide layer CE2 in the normal direction ND. The hydrogen concentration in the first doped region dp1 is different from the hydrogen concentration in the second doped region dp2.

The second gate dielectric layer 140 is located on the second metal oxide layer OS2. The interlayer dielectric layer 150 is located on the second gate dielectric layer 140. The fifth contact hole V5 is penetrating through the interlayer dielectric layer 150, the second gate dielectric layer 140 and the first gate dielectric layer 130. The sixth contact hole V6 is penetrating through the interlayer dielectric layer 150 and the second gate dielectric layer 140.

The first electrode E1 and the second electrode E2 are located on the interlayer dielectric layer 150, wherein the first electrode E1 and the second electrode E2 are electrically connected to the first metal oxide layer CE1 and the second metal oxide layer CE2, respectively. For example, the first electrode E1 is filled into the fifth contact hole V5 and is in contact with the first doped region dp1 of the first metal oxide layer CE1; the second electrode E2 is filled into the sixth contact hole V6 and is in contact with the second metal oxide layer CE2. In some embodiment, the first electrode E1 is electrically connected to one of the first thin film transistor T1 and the second thin film transistor T2 (referring to FIG. 1, FIG. 3 or FIG. 4), and the second electrode E4 is electrically connected to the other one of the first thin film transistor T1 and the second thin film transistor T2 (referring to FIG. 1, FIG. 3 or FIG. 4). In some embodiments, the metal oxide layers in the capacitive device 10D can be formed by the same deposition processes as the metal oxide layers in the thin film transistor, and the metal oxide layers in the capacitive device 10D can be doped with the same doping process as the metal oxide layers in the thin film transistor. Therefore, the fabrication cost of the capacitive device 10D can be saved.

FIG. 6A to FIG. 6D are schematic cross-sectional views of the manufacturing method of the capacitive device 10D of FIG. 5.

Referring to FIG. 6A, the first buffer layer 110 is formed above the substrate 100. The first metal oxide layer CE1' is formed above the first buffer layer 110. The first gate dielectric layer 130 is formed above the first buffer layer 110.

In some embodiments, before forming the first metal oxide layer CE1', a second buffer layer (not shown) is formed on the first buffer layer 110, and the second buffer layer is then patterned by an etching process to expose the first buffer layer 110. Thereby, the subsequently formed first metal oxide layer CE1' may be in contact with the first buffer layer 110.

In some embodiments, hydrogen elements in the first buffer layer 110 diffuses into the first metal oxide layer CE1' so as to reduce the resistivity of the first metal oxide layer CE1'. In some embodiment, the first metal oxide layer CE1' and the first metal oxide layer OS1' (referring to FIG. 2A and FIG. 2B) are formed simultaneously. In other word, the first metal oxide layer CE1' and the first metal oxide layer OS1' belong to the same patterned layer.

Referring to FIG. 6B, the second metal oxide layer CE2' is formed on the first gate dielectric layer 130, and the second metal oxide layer CE2' is overlapping with a portion of the first metal oxide layer CE1'. In some embodiments, the second metal oxide layer CE2' and the second metal oxide layer OS2' (referring to FIG. 2D) are formed simultaneously. In other word, the second metal oxide layer CE2' and the second metal oxide layer OS2' belong to the same patterned layer.

Figure 6C:
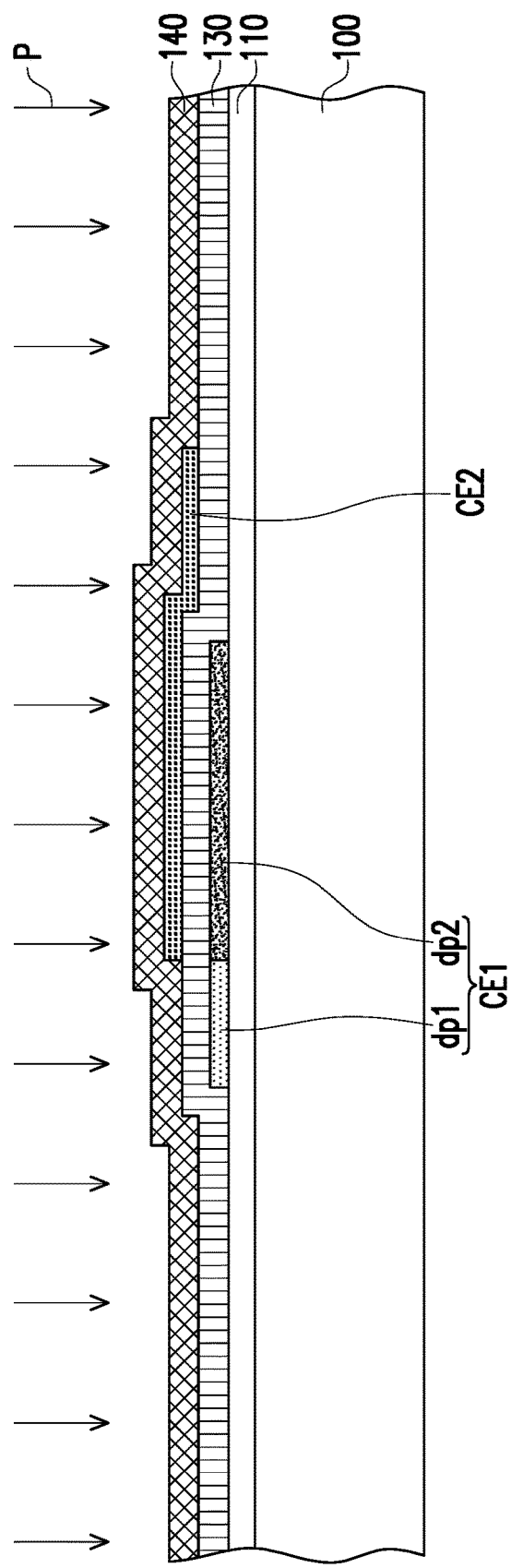

Referring to FIG. 6C, the second gate dielectric layer 140 is formed on the second metal oxide layer CE2' and the first gate dielectric layer 130. Then, a doping process P is performed on the first metal oxide layer CE1' and the second metal oxide layer CE2' to obtain the first metal oxide layer CE1 and the second metal oxide layer CE2. In this embodiment, the second metal oxide layer CE2 shields the portion of the first metal oxide layer CE1, so that the first metal oxide layer CE1 has a first doped region dp1 and a second doped region dp2 with different doping concentrations. In this embodiment, the doping process P is a hydrogen plasma process or other suitable process. In this embodiment, the hydrogen concentration of the first doped region dp1 is greater than the hydrogen concentration of the second doped region dp2. In some embodiments, the doping process P of FIG. 6C and the doping process P of FIG. 2E belong to the same process, thereby saving the fabrication cost. In other words, the first metal oxide layer CE1', the first metal oxide layer OS1', the second metal oxide layer CE2' and the second metal oxide layer OS2' can be simultaneously doped through one doping process P.

Figure 6D:
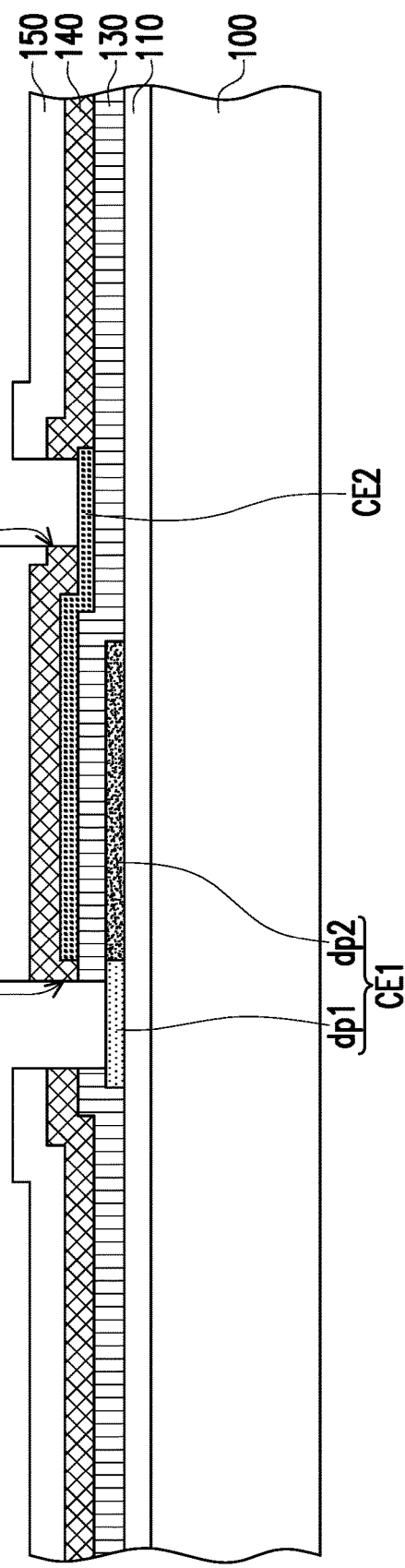

Referring to FIG. 6D, an interlayer dielectric layer 150 is formed on the second gate dielectric layer 140. Then, an etching process is performed to form the fifth contact hole V5 and the sixth contact hole V6. In some embodiments, the process of forming the fifth contact hole V5 and the sixth contact hole V6 and the process (referring to FIG. 2F) of forming the first contact hole V1 to the fourth contact hole V4 belong to the same process, thereby saving the fabrication cost. In other words, the first contact hole V1 to the sixth contact hole V6 can be simultaneously formed through the same mask.

Finally, returning to FIG. 5, the first electrode E1 and the second electrode E2 are formed on the interlayer dielectric layer 150. So far, the capacitive device 10D is substantially completed. In some embodiments, the first electrode E1, the second electrode E2, the first source S1, the first drain D1, the second source S2 and the second drain D2 (referring to FIG. 1) belong to the same patterned layer. In other word, the first electrode E1, the second electrode E2, the first source S1, the first drain D1, the second source S2 and the second drain D2 are simultaneously formed.

Figure 7:
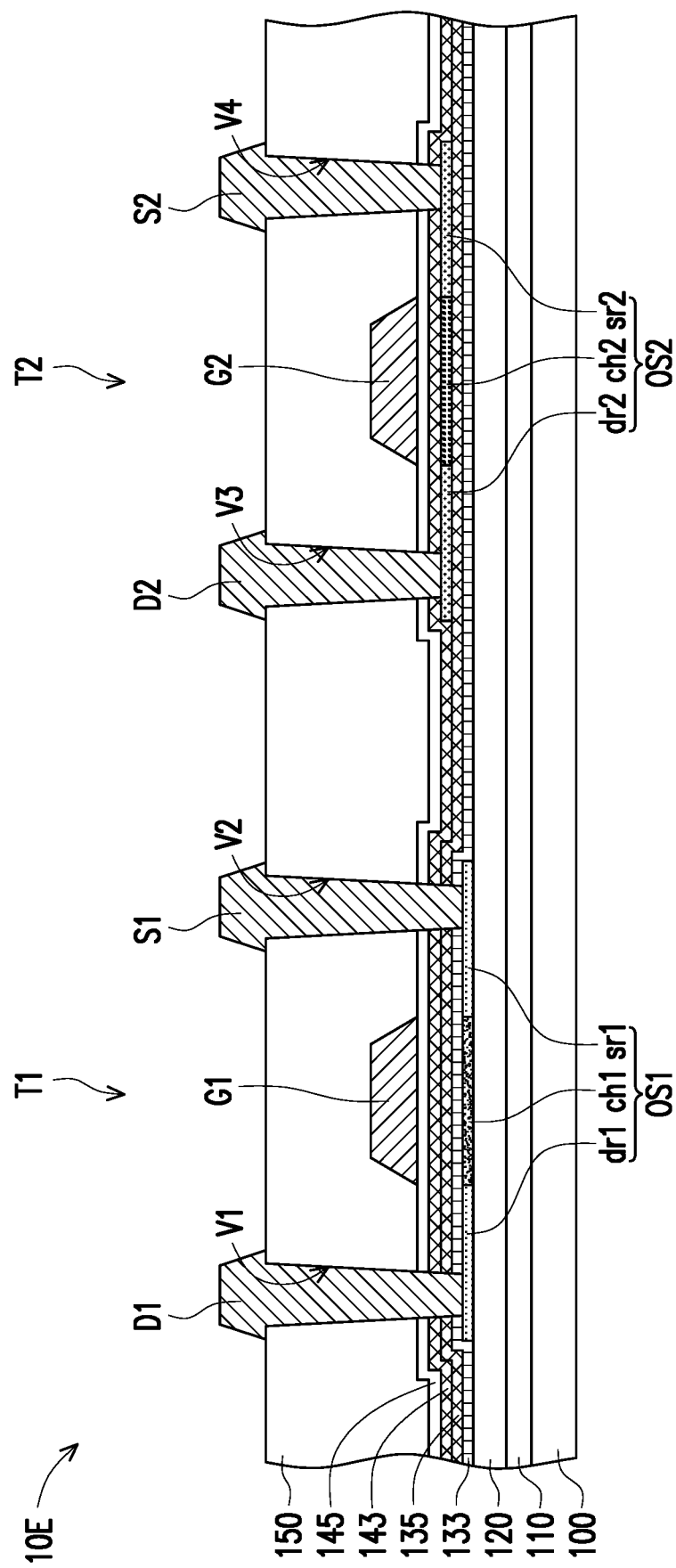
FIG. 7 is a schematic cross-sectional view of an active device substrate of an embodiment according to the present invention.

FIG. 7 is a schematic cross-sectional view of an active device substrate of an embodiment according to the present invention. It should be noted herein that, in embodiments provided in FIG. 7, element numerals and partial content of the embodiments provided in FIG. 1 to FIG. 2F are followed, the same or similar reference numerals being used to represent the same or similar elements, and description of the same technical content being omitted. For a description of an omitted part, reference may be made to the foregoing embodiment, and the descriptions thereof are omitted herein.

Referring to FIG. 7, the active device substrate 10E includes a substrate 100, a first thin film transistor T1 and a second thin film transistor T2.

In some embodiments, the active device substrate 10E further includes a first buffer layer 110 and a second buffer layer 120. In some embodiments, the first buffer layer 110 is blanket-formed on the substrate 100, and the second buffer layer 120 is blanket-formed on the first buffer layer 110. In some embodiments, the thickness of the first buffer layer 110 is in a range from 200 angstroms to 3000 angstroms, and the thickness of the second buffer layer 120 is in a range from 200 angstroms to 3000 angstroms.

The first thin film transistor T1 and the second thin film transistor T2 are located above the substrate 100. In some embodiments, the first thin film transistor T1 and the second thin film transistor T2 are located on the second buffer layer 120. The first thin film transistor T1 includes a first metal oxide layer OS1, a first gate G1, a first source S1 and a first drain D1. The second thin film transistor T2 includes a second metal oxide layer OS2, a second gate G2, a second source S2 and a second drain D2.

The first metal oxide layer OS1 is located on the second buffer layer 120 and is in contact with the top surface of the second buffer layer 120. The first gate dielectric layer 133 is located on the first metal oxide layer OS1. The second gate dielectric layer 135 is located on the first gate dielectric layer 133. The first buffer layer 110 and the second buffer layer 120 are located between the first metal oxide layer OS1 and the substrate 100.

The first metal oxide layer OS1 includes a first source region sr1, a first drain region dr1, and a first channel region ch1 located between the first source region sr1 and the first drain region dr1. In this embodiment, the first source region sr1, the first drain region dr1 and the first channel region ch1 are both located between the second buffer layer 120 and the first gate dielectric layer 133.

The second metal oxide layer OS2 is located on the second gate dielectric layer 135 and is in contact with the top surface of the second gate dielectric layer 135. The third gate dielectric layer 143 is located on the second gate dielectric layer 135. The fourth gate dielectric layer 145 is located on the third gate dielectric layer 143. The second metal oxide layer OS2 is located between the second gate dielectric layer 135 and the third gate dielectric layer 143. The first buffer layer 110, the second buffer layer 120, the first gate dielectric layer 133 and the second gate dielectric layer 135 are located between the second metal oxide layer OS2 and the substrate 100.

The second metal oxide layer OS2 includes a second source region sr2, a second drain region dr2, and a second channel region ch2 located between the second source region sr2 and the second drain region dr2. In this embodiment, the second source region sr2, the second drain region dr2 and the second channel region ch2 are both located between the second gate dielectric layer 135 and the third gate dielectric layer 143.

In some embodiments, the second buffer layer 120, the first gate dielectric layer 133, the second gate dielectric layer 135, and the third gate dielectric layer 143 contain oxygen elements. For example, the second buffer layer 120, the first gate dielectric layer 133, the second gate dielectric layer 135 and the third gate dielectric layer 143 include oxygen-containing insulating material such as oxide or oxynitride. For example, the oxygen-containing insulating material may be silicon oxide, silicon oxynitride, aluminum oxide, hafnium oxide or other suitable material. In some embodiments, the material of the fourth gate dielectric layer 145 includes silicon oxide, silicon nitride, silicon oxynitride, aluminum oxide, hafnium oxide or other suitable materials.

In some embodiments, the second buffer layer 120 and/or the first gate dielectric layer 133 supplement oxygen to the first metal oxide layer OS1 to increase the resistivity of the first metal oxide layer OS1. In some embodiments, the second gate dielectric layer 135 and/or the third gate dielectric layer 143 supplement oxygen to the second metal oxide layer OS2 to increase the resistivity of the second metal oxide layer OS2.

In some embodiments, the oxygen concentration of the second gate dielectric layer 135 and the oxygen concentration of the third gate dielectric layer 143 are higher than the oxygen concentration of the first gate dielectric layer 133. Therefore, the second gate dielectric layer 135 and the third gate dielectric layer 143 have better ability of oxygen supplementation. Therefore, the failure of the second thin film transistor T2 due to the low resistivity of the second channel region ch2 of the second metal oxide layer OS2 can be avoided. Therefore, a material with high carrier mobility can be used to form the second metal oxide layer OS2.

In some embodiments, the thickness of the second buffer layer 120 is in a range from 1000 angstroms to 4000 angstroms. In some embodiments, the thicknesses of the first gate dielectric layer 135, the second gate dielectric layer 135, the third gate dielectric layer 143 and the fourth gate dielectric layer 145 are in a range from 200 angstroms to 500 angstroms, respectively.

In some embodiments, the materials of the first metal oxide layer OS1 and the second metal oxide layer OS2 include indium gallium tin zinc oxide (IGTZO), or quaternary metal compounds such as indium gallium zinc oxide (IGZO), indium tin zinc oxide (ITZO), aluminum zinc tin oxide (AZTO)) or indium tungsten zinc oxide (IWZO), or oxides comprising ternary metal containing any three of gallium (Ga), zinc (Zn), indium (In), tin (Sn), aluminum (Al), and tungsten (W), or lanthanide rare earth doped metal oxide (e.g., Ln-IZO). In some embodiments, the first metal oxide layer OS1 and the second metal oxide layer OS2 include the same material. In other embodiments, the first metal oxide layer OS1 and the second metal oxide layer OS2 include different materials. In some embodiments, the carrier mobility of the first channel region ch1 of the first metal oxide layer OS1 is different from (greater than or smaller than) the carrier mobility of the second channel region ch2 of the second metal oxide layer OS2.

The first gate G1 and the second gate G2 are located on the fourth gate dielectric layer 145 and overlap the first channel region ch1 and the second channel region ch2 respectively. The first gate dielectric layer 133, the second gate dielectric layer 135, the third gate dielectric layer 143 and the fourth gate dielectric layer 145 are located between the first gate G1 and the first metal oxide layer OS1. The third gate dielectric layer 143 and the fourth gate dielectric layer 145 are located between the second gate G2 and the second metal oxide layer OS2.

The thickness of the insulating material(s) between the first gate G1 and the first metal oxide layer OS1 is greater than the thickness of the insulating material(s) between the second gate G2 and the second metal oxide layer OS2. Thereby, the first thin film transistor T1 and the second thin film transistor T2 have different characteristics. For example, the first thin film transistor T1 has a larger sub-threshold swing and better long-term operation reliability; the second thin film transistor T2 has high operating current and small subthreshold swing, and the second thin film transistor T2 can perform high-speed switching.

The interlayer dielectric layer 150 is located on the fourth gate dielectric layer 145 and covers the first gate G1 and the second gate G2. In some embodiments, the material of the interlayer dielectric layer 150 includes silicon oxide, silicon nitride, silicon oxynitride, hafnium oxide, aluminum oxide or other insulating materials.

The first contact hole V1 and the second contact hole V2 are penetrating through the interlayer dielectric layer 150, the first gate dielectric layer 133, the second gate dielectric layer 135, the third gate dielectric layer 143 and the fourth gate dielectric layer 145. The first drain D1 and the first source S1 are located on the interlayer dielectric layer 150 and are respectively filled into the first contact hole V1 and the second contact hole V2 to electrically connect the first metal oxide layer OS1. The first drain D1 and the first source S1 are respectively connected to the first drain region dr1 and the first source region sr1 of the first metal oxide layer OS1.

The third contact hole V3 and the fourth contact hole V4 are penetrating through the interlayer dielectric layer 150, the third gate dielectric layer 143 and the fourth gate dielectric layer 145. The second drain D2 and the second source S2 are located on the interlayer dielectric layer 150 and are respectively filled into the third contact hole V3 and the fourth contact hole V4 to electrically connect the second metal oxide layer OS2. The second drain D2 and the second source S2 are respectively connected to the second drain region dr2 and the second source region sr2 of the second metal oxide layer OS2.

FIG. 8A to FIG. 8D are schematic cross-sectional views of the manufacturing method of the active device substrate 10E of FIG. 7.

Referring to FIG. 8A, a first metal oxide layer OS1' is formed on the substrate. In this embodiment, the first metal oxide layer OS1' is formed on the second buffer layer 120. In some embodiments, the process temperature for forming the first metal oxide layer OS1' is in a range from room temperature to 300 degrees Celsius.

Referring to FIG. 8B, the first gate dielectric layer 133 is formed on the first metal oxide layer OS1'. The second gate dielectric layer 135 is formed on the first gate dielectric layer 133. In some embodiments, the process temperature for forming the second gate dielectric layer 135 is lower than the process temperature for forming the first gate dielectric layer 133. For example, the process temperature for forming the second gate dielectric layer 135 is in a range from 200 degrees Celsius to 300 degrees Celsius, and the process temperature for forming the first gate dielectric layer 133 is in a range from 300 degrees Celsius to 400 degrees Celsius. In some embodiments, the first gate dielectric layer 133 and the second gate dielectric layer 135 include the same material (e.g., silicon oxide). However, due to the lower process temperature for the formation of the second gate dielectric layer 135, more oxygen elements may be stored in the second gate dielectric layer 135, so that the oxygen concentration of the second gate dielectric layer 135 is higher than that of the first gate dielectric layer 133.

A second metal oxide layer OS2' is formed on the second gate dielectric layer 135. In some embodiments, the process temperature for forming the second metal oxide layer OS2' is in a range from 200 degrees Celsius to 300 degrees Celsius. In some embodiments, the first metal oxide layer OS1' and the second metal oxide layer OS2' include the same material (for example, both are indium gallium zinc oxide). Since the process temperature for forming the second metal oxide layer OS2' is lower, the carrier mobility of the second metal oxide layer OS2' layer OS2' is lower than that of the first metal oxide layer OS1', but the present invention is not limited thereto. In other embodiments, the second metal oxide layer OS2' and the first metal oxide layer OS1' include different materials, and the carrier mobility of the second metal oxide layer OS2' is higher than that of the first metal oxide layer OS1'.

Figure 8C:
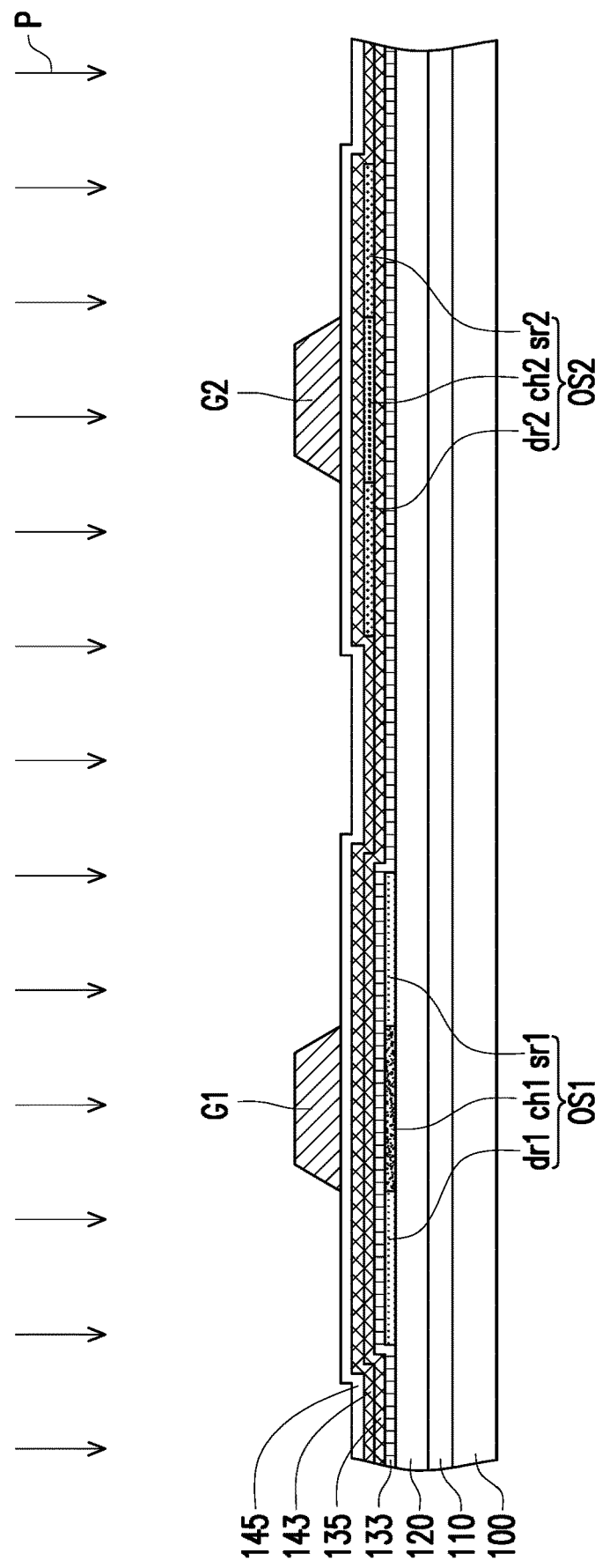

Referring to FIG. 8C, the third gate dielectric layer 143 is formed on the second metal oxide layer OS2'. In some embodiments, the process temperature for forming the third gate dielectric layer 143 is lower than the process temperature for forming the first gate dielectric layer 133. For example, the process temperature for forming the third gate dielectric layer 143 is in a range from 200 degrees Celsius to 300 degrees Celsius. In some embodiments, the first gate dielectric layer 133 and the third gate dielectric layer 143 include the same material (e.g., silicon oxide). However, but due to the lower process temperature for the formation of the third gate dielectric layer 143, more oxygen elements may be stored in the third gate dielectric layer 143, so that the oxygen concentration of the third gate dielectric layer 143 is higher than that of the first gate dielectric layer 133.

The fourth gate dielectric layer 145 is formed on the third gate dielectric layer 143. In some embodiments, the process temperature for forming the fourth gate dielectric layer 145 is in a range from 200 degrees Celsius to 400 degrees Celsius.

The first gate G1 and the second gate G2 are formed above the fourth gate dielectric layer 145. Then, using the first gate G1 and the second gate G2 as a mask, a doping process P is performed on the first metal oxide layer OS1' and the second metal oxide layer OS2' to form the first metal oxide layer OS1 including the first source region sr1, the first drain region dr1 and the first channel region ch1 and the second metal oxide layer OS2 including the second source region sr2, the second drain region dr2 and the second channel region ch2. In some embodiments, the doping process P is, for example, a hydrogen plasma process or other suitable processes.

During the process, the second buffer layer 120, the first gate dielectric layer 133, the second gate dielectric layer 135 and the third gate dielectric layer 143 provide oxygen elements, thereby enhancing the resistivity of the first metal oxide dielectric layer OS1 and the second metal oxide layer OS2.

In this embodiment, since the oxygen concentrations of the second gate dielectric layer 135 and the third gate dielectric layer 143 are higher, more oxygen elements can be provided to the second metal oxide layer OS2. This avoids the problem that the second channel region ch2 of the second metal oxide layer OS2 become a conductor due to excessive carrier mobility. In some embodiment, the resistivity of the first channel region ch1 is different from the resistivity of the second channel region ch2. In some embodiments, the resistivity of the first drain region dr1 and the first source region sr2 is different from the resistivity of the second drain region dr2 and the second source region sr2.

In this embodiment, the first gate G1 and the second gate G2 belong to the same patterned layer, and the first metal oxide layer OS1 and the second metal oxide layer OS2 can be doped through the same doping process P. Therefore, the fabrication cost of the first thin film transistor and second thin film transistor can be saved.

Figure 8D:
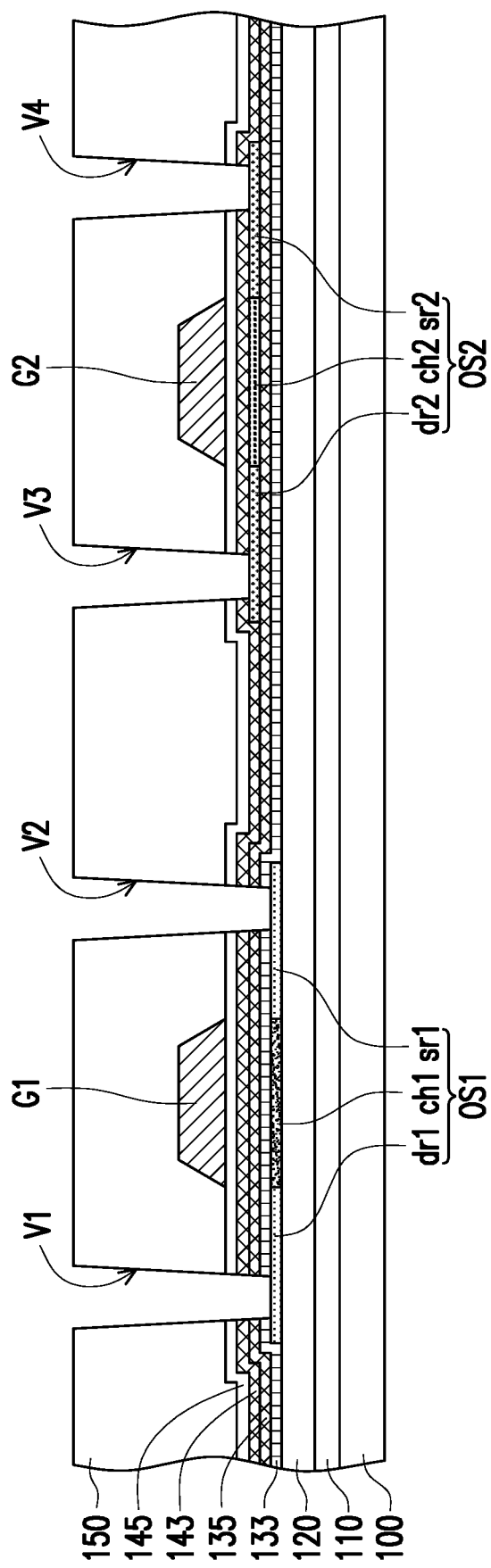

Referring to FIG. 8D, the interlayer dielectric layer 150 is formed on the fourth gate dielectric layer 145. Then, an etching process is performed to form the first contact hole V1, the second contact hole V2, the third contact hole V3 and the fourth contact hole V4.

Finally, returning to FIG. 7, the first drain D1, the first source S1, the second drain D2 and the second source S2 are formed on the interlayer dielectric layer 150 and are filled into the first contact hole V1, the second contact hole V2, the third contact hole V3 and the fourth contact hole V4. So far, the active device substrate 10E is substantially completed.

Figure 9:
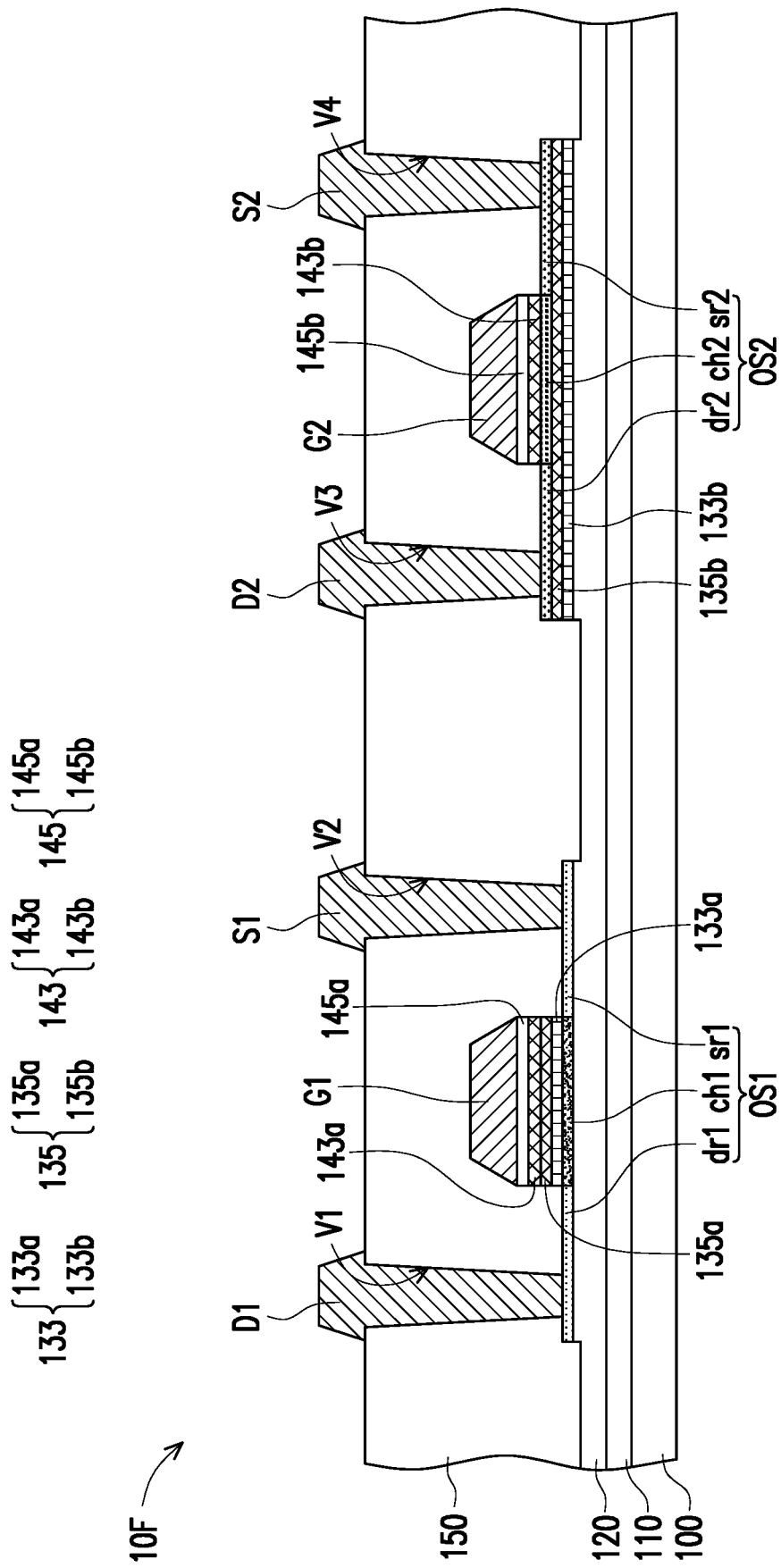
FIG. 9 is a schematic cross-sectional view of an active device substrate of an embodiment according to the present invention.

FIG. 9 is a schematic cross-sectional view of an active device substrate of an embodiment according to the present invention. It should be noted herein that, in embodiments provided in FIG. 9, element numerals and partial content of the embodiments provided in FIG. 7 to FIG. 8D are followed, the same or similar reference numerals being used to represent the same or similar elements, and description of the same technical content being omitted. For a description of an omitted part, reference may be made to the foregoing embodiment, and the descriptions thereof are omitted herein.

The main difference between the active device substrate 10F of FIG. 9 and the active device substrate 10E of FIG. 7 is that: in the active device substrate 10F, the first gate dielectric layer 133 includes a first dielectric structure 133a and a second dielectric structure 133b, the second gate dielectric layer 135 includes a third dielectric structure 135a and fourth dielectric structure 135b, the third gate dielectric layer 143 includes a fifth dielectric structure 143a and a sixth dielectric structure 143b, and the fourth gate dielectric layer 145 includes a seventh dielectric structure 145a and a eighth dielectric structure 145b.

The first gate G1 is overlapping with the first dielectric structure 133a, the third dielectric structure 135a, the fifth dielectric structure 143a and the seventh dielectric structure 145a. The first dielectric structure 133a, the third dielectric structure 135a, the fifth dielectric structure 143a and the seventh dielectric structure 145a are located between the first gate G1 and the first channel region ch1.

The second gate G2 is overlapping with the second dielectric structure 133b, the fourth dielectric structure 135b, the sixth dielectric structure 143b and the eighth dielectric structure 145b. The sixth dielectric structure 143b and the eighth dielectric structure 145b are located between the second gate G2 and the second dielectric channel region ch2. The second dielectric structure 133b and the fourth dielectric structure 135b are located between the second metal oxide layer OS2 and the second buffer layer 120.

The interlayer dielectric layer 150 is in contact with the sidewall of the first dielectric structure 133a, the sidewall of the second dielectric structure 133b, the sidewall of the third dielectric structure 135a, the sidewall of the fourth dielectric structure 135b, the sidewall of the fifth dielectric structure 143a, the sidewall of the sixth dielectric structure 143b, the sidewall of the seventh dielectric structure 145a, the sidewall of the eighth dielectric structure 145b, the first source region sr1, the first drain region dr1, the second source region sr2, the second drain region dr2 and the top surface of the second buffer layer 120.

Figure 10A:
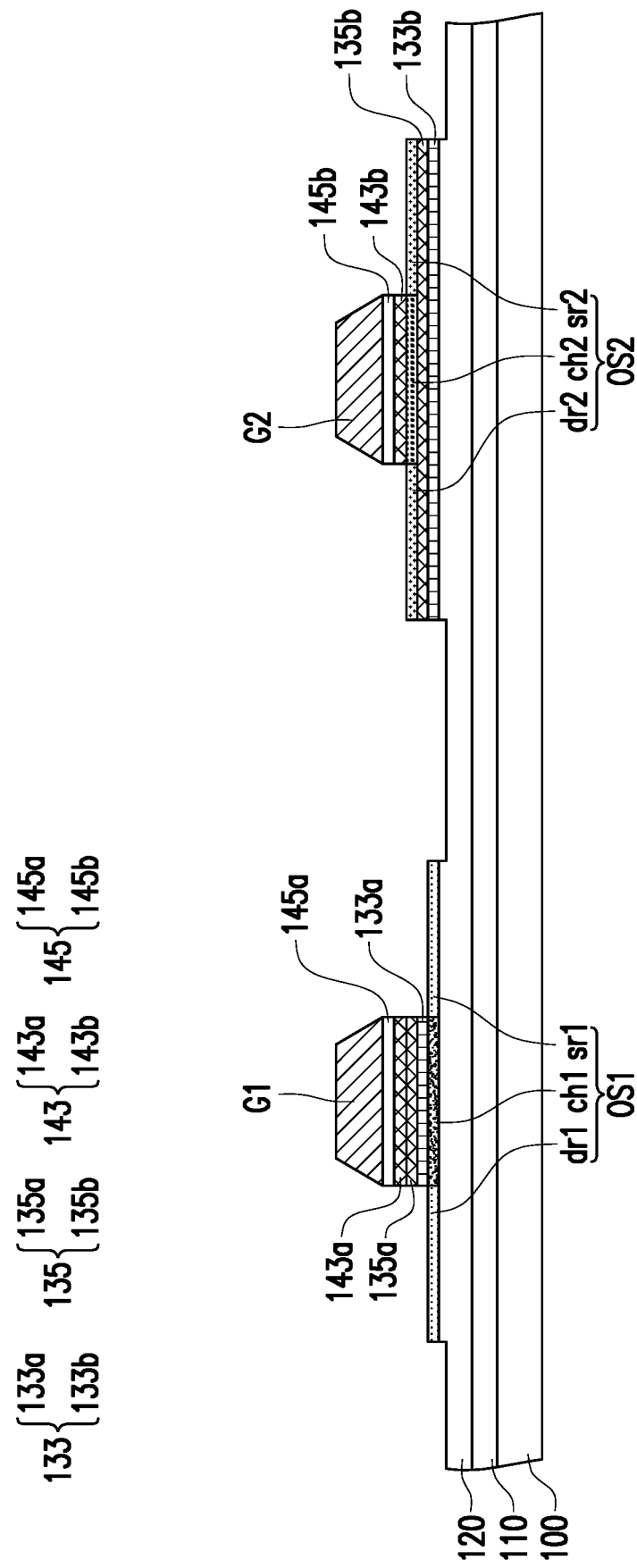
FIG. 10A to FIG. 10B are schematic cross-sectional views of the manufacturing method of the active device substrate of FIG. 9.
Figure 10B:
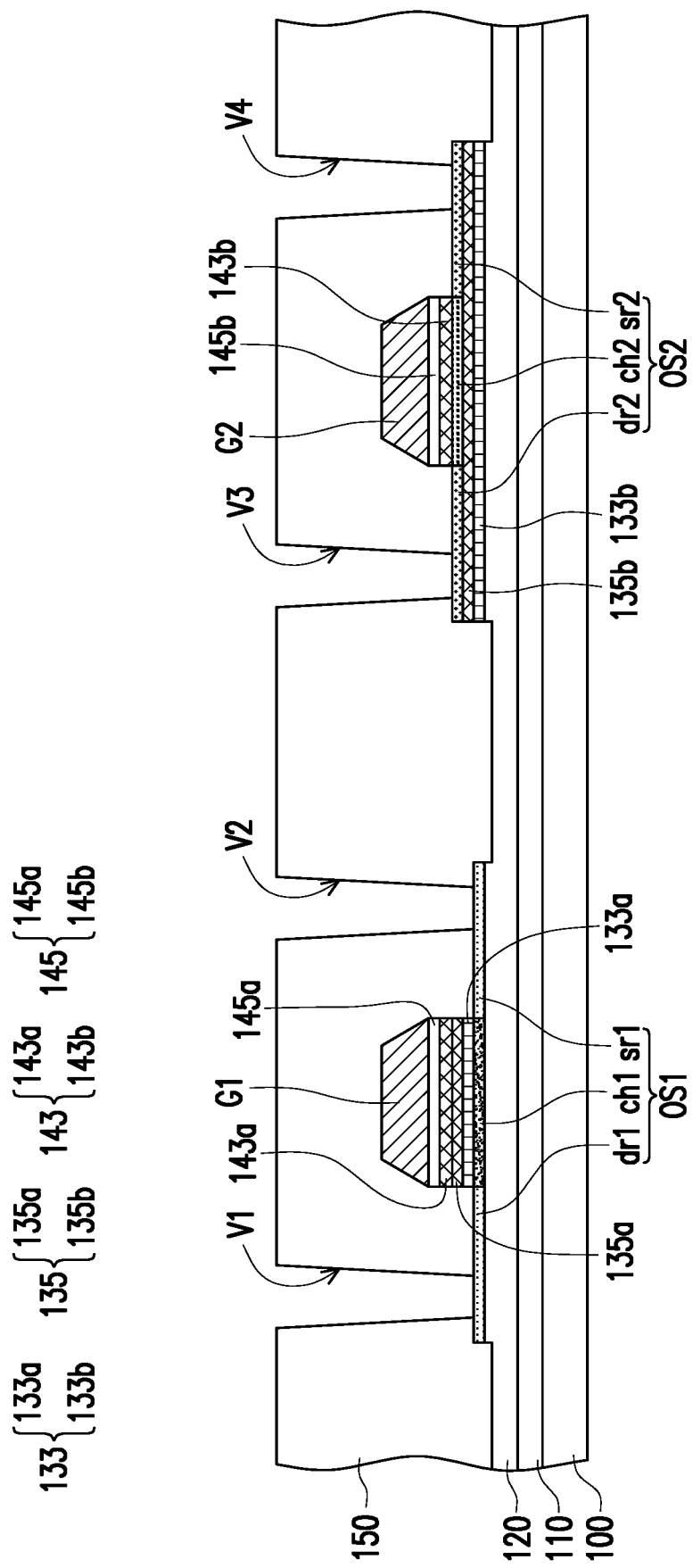

FIG. 10A to 10B are schematic cross-sectional views of the manufacturing method of the active device substrate 10F of FIG. 9.

Referring to FIG. 10A, following the process of FIG. 8C, using the first gate G1, the second gate G2 and the second metal oxide layer OS2 as a mask, the first gate dielectric layer 133, the second gate dielectric layer 135, the third gate dielectric layer 143 and the fourth gate dielectric layer 145 are etched. In some embodiments, a portion of the second buffer layer 120 is also removed by the aforementioned etching process. The doping process P in FIG. 8C may be performed before the aforementioned etching process or after the aforementioned etching process, and the present invention does not limit the order of the doping process P and the aforementioned etching process.

In this embodiment, the sidewalls of the first dielectric structure 133a, the third dielectric structure 135a, the fifth dielectric structure 143a and the seventh dielectric structure 145a are aligned with the sidewall of the first gate G1. The sidewalls of the sixth dielectric structure 143b and the eighth dielectric structure 145b are aligned with the sidewalls of the second gate G2. The sidewalls of the second dielectric structure 133b and the fourth dielectric structure 135b are aligned with the sidewall of the second metal oxide layer OS2.

Referring to FIG. 10B, the interlayer dielectric layer 150 is formed on the second buffer layer 120, the first metal oxide layer OS1 and the second metal oxide layer OS2. The interlayer dielectric layer 150 is directly in contact with the first source region sr1, the first drain region dr1, the second source region sr2 and the second drain region dr2. In some embodiments, the interlayer dielectric layer 150 contains hydrogen elements, and the hydrogen elements in the interlayer dielectric layer 150 diffuses into the first source region sr1, the first drain region dr1, the second source region sr2 and the second drain region dr2, so as to reduce the resistivity of the first source region sr1, the first drain region dr1, the second source region sr2 and the second drain region dr2.

After that, an etching process is performed to form the first contact hole V1, the second contact hole V2, the third contact hole V3 and the fourth contact hole V4.

Finally, returning to FIG. 9, the first drain D1, the first source S1, the second drain D2 and the second source S2 are formed on the interlayer dielectric layer 150 and are filled into the first contact hole V1, the second contact hole V2, the third contact hole V3 and the fourth contact hole V4. So far, the active device substrate 10F is substantially completed.

What is claimed is:

1. An active device substrate, comprising:
   a substrate;
   a first thin film transistor, located above the substrate, and comprising:
      a first metal oxide layer;
      a first gate, wherein a first gate dielectric layer and a second gate dielectric layer are located between the first gate and the first metal oxide layer, wherein the first gate dielectric layer comprises a first dielectric structure and a second dielectric structure; and
      a first source and a first drain, electrically connected to the first metal oxide layer;
   a second thin film transistor, located above the substrate, and comprising:
      a second metal oxide layer, wherein the first dielectric structure is located between the first gate and the first metal oxide layer, and the second dielectric structure is located between the second metal oxide layer and the substrate;
      a second gate, wherein the second gate dielectric layer is located between the second gate and the second metal oxide layer, and the second metal oxide layer is located between the first gate dielectric layer and the second gate dielectric layer, wherein the first gate and the second gate belong to a same patterned layer; and
      a second source and a second drain, electrically connected to the second metal oxide layer;
   a first buffer layer, located above the substrate, and the first buffer layer contains hydrogen elements; and
   a second buffer layer, located on the first buffer layer, and the second buffer layer contains oxygen elements, wherein the second buffer layer comprises:
      a first oxygen-containing structure, located between the first metal oxide layer and the first buffer layer; and
      a second oxygen-containing structure, located between the second dielectric structure and the first buffer layer, wherein the second metal oxide layer is in contact with a top surface of the second dielectric structure, a side surface of the second dielectric structure, a side surface of the second oxygen-containing structure and a top surface of the first buffer layer.

2. The active device substrate of claim 1, further comprising:
   a first bottom gate, located between the first buffer layer and the substrate, and wherein the first metal oxide layer is located between the first gate and the first bottom gate; and
   a second bottom gate, located between the first buffer layer and the substrate, and the second metal oxide layer is located between the second gate and the second bottom gate.

3. An active device substrate, comprising:
   a substrate;
   a first thin film transistor, located above the substrate, and comprising:
      a first metal oxide layer;
      a first gate, wherein a first gate dielectric layer and a second gate dielectric layer are located between the first gate and the first metal oxide layer; and
      a first source and a first drain, electrically connected to the first metal oxide layer;
   a second thin film transistor, located above the substrate, and comprising:
      a second metal oxide layer;
      a second gate, wherein the second gate dielectric layer is located between the second gate and the second metal oxide layer, and the second metal oxide layer is located between the first gate dielectric layer and the second gate dielectric layer, wherein the first gate and the second gate belong to a same patterned layer; and
      a second source and a second drain, electrically connected to the second metal oxide layer;
   a first buffer layer, located above the substrate, and the first buffer layer contains hydrogen elements; and
   a second buffer layer, located on the first buffer layer, and the second buffer layer contains oxygen elements, wherein the second buffer layer comprises:
      a first oxygen-containing structure, located between the first metal oxide layer and the first buffer layer, wherein the first metal oxide layer is in contact with a top surface of the first oxygen-containing structure, a side surface of the first oxygen-containing structure and a top surface of the first buffer layer; and
      a second oxygen-containing structure, located between the second metal oxide layer and the first buffer layer, wherein the second metal oxide layer is in contact with a top surface of the first gate dielectric layer.

4. The active device substrate of claim 3, wherein the first metal oxide layer comprises a first drain region, a first source region, a first channel region, a first resistivity gradient region located between the first drain region and the first channel region and a second resistivity gradient region located between the first source region and the first channel region, wherein a distance between the first channel region and the substrate is greater than a distance between the first drain region and the substrate and a distance between the first source region and the substrate.

5. The active device substrate of claim 1, wherein the second metal oxide layer comprises a second drain region, a second source region, a second channel region, a third resistivity gradient region located between the second drain region and the second channel region and a fourth resistivity gradient region located between the second source region and the second channel region, wherein a distance between the second channel region and the substrate is greater than a distance between the second channel region and the second drain region and a distance between the second channel region and the second source region.

6. The active device substrate of claim 1, wherein the first gate dielectric layer and the second gate dielectric layer comprise oxide or oxynitride.

7. An active device substrate, comprising:
   a substrate;
   a first thin film transistor, located above the substrate, and comprising:
      a first metal oxide layer;
      a first gate, wherein a first gate dielectric layer, a second gate dielectric layer, a third gate dielectric layer and a fourth gate dielectric layer are located between the first gate and the first metal oxide layer, wherein the first gate dielectric layer comprises a first gate dielectric structure and a second dielectric structure, the second gate dielectric layer comprises a third dielectric structure and a fourth dielectric structure, the third gate dielectric layer comprises a fifth dielectric structure and a sixth dielectric structure, and the fourth gate dielectric layer comprises a seventh dielectric structure and an eighth dielectric structure, and wherein the first gate is overlapping with the first dielectric structure, the third dielectric structure, the fifth dielectric structure and the seventh dielectric structure, and the second gate is overlapping with the second dielectric structure, the fourth dielectric structure, the sixth dielectric structure and the eighth structure;
      an interlayer dielectric layer, in contact with a sidewall of the first dielectric structure, a sidewall of the second dielectric structure, a sidewall of the third dielectric structure, a sidewall of the fourth dielectric structure, a sidewall of the fifth dielectric structure, a sidewall of the sixth dielectric structure, a sidewall of the seventh dielectric structure and a sidewall of the eighth dielectric structure; and
      a first source and a first drain, electrically connected to the first metal oxide layer; and
   a second thin film transistor, located above the substrate, and comprising:
      a second metal oxide layer;
      a second gate, wherein the third gate dielectric layer and the fourth gate dielectric layer are located between the second gate and the second metal oxide layer, and the second metal oxide layer is located between the second gate dielectric layer and the third gate dielectric layer, wherein an oxygen concentration of the second gate dielectric layer and an oxygen concentration of the third gate dielectric layer are higher than an oxygen concentration of the first gate dielectric layer; and
      a second source and a second drain, electrically connected to the second metal oxide layer.

8. The active device substrate of claim 7, further comprising:
   a first buffer layer, blanket-formed above the substrate; and
   a second buffer layer, blanket-formed on the first buffer layer, and wherein the first metal oxide layer is located on the second buffer layer, wherein a thickness of the first gate dielectric layer, a thickness of the second gate dielectric layer, a thickness of the third gate dielectric layer and a thickness of the fourth gate dielectric layer are respectively in a range from 200 angstroms to 500 angstroms, and a thickness of the first buffer layer and a thickness of the second buffer layer are respectively in a range from 200 angstroms to 3000 angstroms.

9. The active device substrate of claim 7, wherein the first gate and the second gate belong to a same patterned layer, and wherein the first metal oxide layer comprises a first drain region, a first source region and a first channel region located between the first drain region and the first source region, and the second metal oxide layer comprises a second drain region, a second source region and a second channel region located between the second drain region and the second source region, and wherein a resistivity of the first drain region and the first source region is different from a resistivity of the second drain region and the second source region.

10. The active device substrate of claim 9, wherein a carrier mobility of the first channel region is different from a carrier mobility of the second channel region.

11. A manufacturing method of an active device substrate, comprising:
   forming a first metal oxide layer above a substrate;
   forming a first gate dielectric layer above the first metal oxide layer;
   forming a second gate dielectric layer above the first gate dielectric layer, wherein a process temperature for forming the second gate dielectric layer is lower than a process temperature for forming the first gate dielectric layer, and an oxygen concentration of the second gate dielectric layer is higher than an oxygen concentration of the first gate dielectric layer;
   forming a second metal oxide layer above the second gate dielectric layer;
   forming a third gate dielectric layer above the second metal oxide layer, wherein a process temperature for forming the third gate dielectric layer is lower than the process temperature for forming the first gate dielectric layer, and an oxygen concentration of the third gate dielectric layer is higher than the oxygen concentration of the first gate dielectric layer;
   forming a fourth gate dielectric layer on the third gate dielectric layer;
   forming a first gate and a second gate above the fourth gate dielectric layer, wherein the first gate dielectric layer, the second gate dielectric layer, the third gate dielectric layer and the fourth gate dielectric layer are located between the first gate and the first metal oxide layer, and the third gate dielectric layer and the fourth gate dielectric layer are located between the second gate and the second metal oxide layer;
   performing an etching process on the first gate dielectric layer, the second gate dielectric layer, the third gate dielectric layer and the fourth gate dielectric layer, wherein the first gate dielectric layer comprises a first gate dielectric structure and a second dielectric structure after the etching process, the second gate dielectric layer comprises a third dielectric structure and a fourth dielectric structure after the etching process, the third gate dielectric layer comprises a fifth dielectric structure and a sixth dielectric structure after the etching process, and the fourth gate dielectric layer comprises a seventh dielectric structure and an eighth dielectric structure after the etching process, and wherein the first gate is overlapping with the first dielectric structure, the third dielectric structure, the fifth dielectric structure and the seventh dielectric structure, and the second gate is overlapping with the second dielectric structure, the fourth dielectric structure, the sixth dielectric structure and the eighth structure; and forming an interlayer dielectric layer in contact with a sidewall of the first dielectric structure, a sidewall of the second dielectric structure, a sidewall of the third dielectric structure, a sidewall of the fourth dielectric structure, a sidewall of the fifth dielectric structure, a sidewall of the sixth dielectric structure, a sidewall of the seventh dielectric structure and a sidewall of the eighth dielectric structure;

forming a first source and a first drain electrically connected to the first metal oxide layer; and forming a second source and a second drain electrically connected to the second metal oxide layer.

12. The manufacturing method of the active device substrate of claim 11, wherein the process temperature for forming the second gate dielectric layer and the process temperature for forming the third gate dielectric layer are in a range from 200 degrees Celsius to 300 degrees Celsius, and the process temperature for forming the first gate dielectric layer is in a range from 300 degrees Celsius to 400 degrees Celsius.

13. The manufacturing method of the active device substrate of claim 11, wherein a process temperature for forming the fourth gate dielectric layer is in a range from 200 degrees Celsius to 400 degrees Celsius.

14. The manufacturing method of the active device substrate of claim 11, further comprising:

using the first gate and the second gate as a mask to perform a doping process on the first metal oxide layer and the second metal oxide layer.

* * * * *

UNITED STATES PATENT AND TRADEMARK OFFICE
CERTIFICATE OF CORRECTION

PATENT NO. : 12,363,952 B2  
APPLICATION NO. : 17/879802  
DATED : July 15, 2025  
INVENTOR(S) : Chen-Shuo Huang et al.

Page 1 of 1

It is certified that error appears in the above-identified patent and that said Letters Patent is hereby corrected as shown below:

On the Title Page

Item (73) Assignee should read: AUO Corporation, Hsinchu City (TW)

Signed and Sealed this  
Twenty-third Day of September, 2025

John A. Squires  
*Director of the United States Patent and Trademark Office*